(12) United States Patent
Aoki

(10) Patent No.: US 6,937,065 B2
(45) Date of Patent: Aug. 30, 2005

(54) LEVEL SHELTER, SEMICONDUCTOR INTEGRATED CIRCUIT AND INFORMATION PROCESSING SYSTEM

(75) Inventor: Junichi Aoki, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/454,633

(22) Filed: Jun. 5, 2003

(65) Prior Publication Data

US 2004/0000929 A1 Jan. 1, 2004

(30) Foreign Application Priority Data

Jun. 28, 2002 (JP) .......................................... 2002-191518

(51) Int. Cl.[7] .......................................... H03K 19/0175
(52) U.S. Cl. .............................. 326/81; 326/80; 326/68
(58) Field of Search .............................. 326/63, 68, 80, 326/81; 327/333

(56) References Cited

U.S. PATENT DOCUMENTS

| 5,204,557 | A | * | 4/1993 | Nguyen ........................ 326/81 |
| 5,723,986 | A | * | 3/1998 | Nakashiro et al. ............ 326/81 |
| 5,786,723 | A | * | 7/1998 | Kim ............................ 327/530 |
| 2003/0001494 | A1 | | 1/2003 | Wakimoto et al. | |

FOREIGN PATENT DOCUMENTS

| JP | 59-216328 | 12/1984 |
| JP | 1-152817 | 6/1989 |
| JP | 6-164365 | 6/1994 |
| JP | 11-239051 | 8/1999 |
| JP | 2000-244307 | 9/2000 |
| JP | 2001-244804 | 9/2001 |
| JP | 2003-18711 | 1/2003 |
| JP | 2002-289878 | 10/2004 |

* cited by examiner

Primary Examiner—Anh Q. Tran
(74) Attorney, Agent, or Firm—Young & Thompson

(57) ABSTRACT

A level shifter normally operates with low power consumption at a high operating frequency. The level shifter, including a first level shifter, which has transistors MP3 and MP4, which have a supply voltage VDD applied to respective sources and respective gates connected to the other's drain, and transistors MN3 and MN4, which have signals SIN and SINB applied to respective gates, respective drains connected to the transistors MP3 and MP4 drains, and respective sources grounded; and a second level shifter, which has transistors MN5 and MN6, which have respective sources grounded and respective drains connected to the other's gate, and transistors MP5 and MP6, which have a supply voltage VDD applied to respective sources, signals SIN and SINB applied to respective gates, and respective drains connected to the transistors MP5 and MP6 drains; wherein the drains of the transistors MP3 and MN5 are connected to each other, and the drains of the transistors MP4 and MN6 are connected to each other.

25 Claims, 17 Drawing Sheets

FIG.2
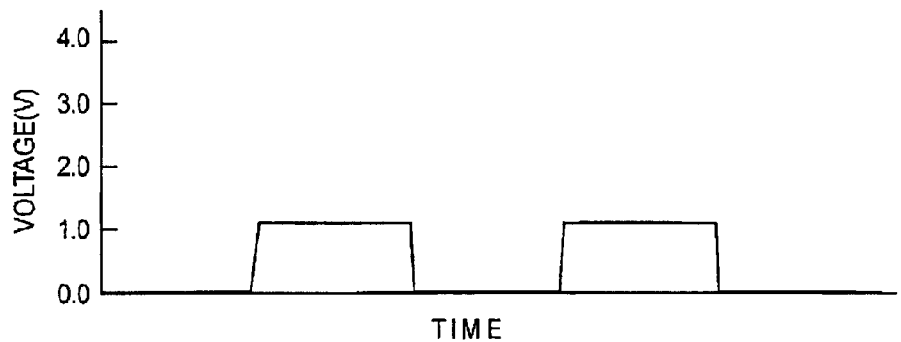
FIG.3
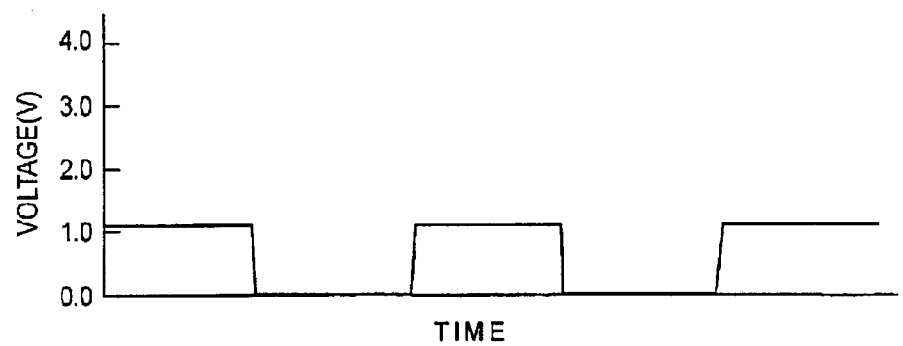
FIG.4
| SIN | MN3 | MN4 | MP3 | MP4 | NA | NC |
|---|---|---|---|---|---|---|
| VL | OFF STATE | HIGH IMPEDANCE STATE | LOW IMPEDANCE STATE | OFF STATE | VDD | VM2 |
| VH | HIGH IMPEDANCE STATE | OFF STATE | OFF STATE | LOW IMPEDANCE STATE | VM1 | VDD |

FIG.5
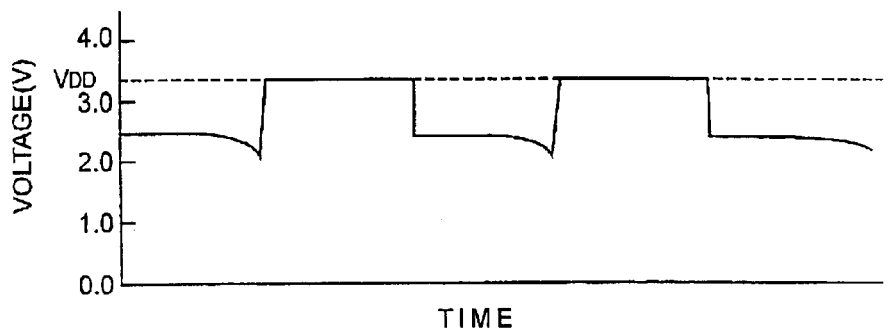
FIG.6
| SIN | MN5 | MN6 | MP5 | MP6 | NB | ND |
|---|---|---|---|---|---|---|
| VL | HIGH IMPEDANCE STATE | ON STATE | ON STATE | LOW IMPEDANCE STATE | VM31 | VM42 |
| VH | ON STATE | HIGH IMPEDANCE STATE | LOW IMPEDANCE STATE | ON STATE | VM31 | VM41 |
FIG.7
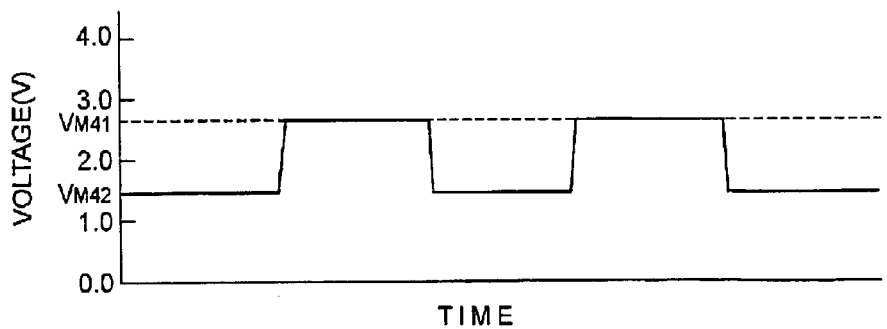

US 6,937,065 B2

LEVEL SHELTER, SEMICONDUCTOR INTEGRATED CIRCUIT AND INFORMATION PROCESSING SYSTEM

BACKGROUND OF THE INVENTION

1. Field of the Invention

The present invention relates to a level shifter, which level-converts an input signal and then outputs the resulting signal, a semiconductor integrated circuit, and an information processing system. In particular, it is related to a level shifter, which converts an input low-level signal into a high-level signal, a semiconductor integrated circuit, and an information processing system.

2. Description of the Prior Art

In recent years, computer motherboards are equipped with multiple devices such as ASIC, microprocessors, memories, and peripheral circuits, and an increasing number of microcomputers are designed to fulfill desired functions. Particularly, since operation with low amounts of power consumption and at high frequencies is required with the ASIC and microprocessors, amplitude of the supply voltage to be internally utilized has been designed to decreased. For example, given a 2.5 V internal supply voltage, this voltage is inclined to decrease to 1.8 V, 1.5 V and 1.2 V in the future.

In contrast, there are many devices such as peripheral circuits that operate at 3.3 V where input/output of data between each device is executed at 3.3 V based on JEDEC system interface standards or the like. Consequently, the condition where the peripheral circuits operate at 3.3 V and the ASIC and microprocessor operate at a different voltage of 2.5 V has been increasing. Accordingly, the ASIC and microprocessor are equipped with input/output buffers with a 3.3 V supply voltage in order to level shift by the voltage difference. In other words, the ASIC and microprocessor run on two power supplies, where an internal power supply is 2.5 V and an input/output buffer power supply is 3.3 V.

Such level shifting function-equipped conventional input/output buffer is illustrated in FIG. 24. The conventional input/output buffer (level shifter) is one that converts a 2.5 V amplitude input signal $S_{IN}$ to the level of a 3.3 V amplitude output signal $S_{OUT}$, and is configured from an inverter $INV_1$, 3.3 V-tolerant P-channel MOS transistors $M_{P1}$ and $M_{P2}$, and 3.3 V-tolerant N-channel MOS transistors $M_{N1}$ and $M_{N2}$. Hereafter, a MOS transistor is simply referred to as a transistor.

The inverter $INV_1$ has a CMOS structure, which is configured from a P-channel transistor and an N-channel transistor, and inverts the 2.5 V amplitude input signal $S_{IN}$ so as to output an inverted input signal $S_{INB}$ with an amplitude of 2.5 V. The transistor $M_{P1}$ has a 3.3 V supply voltage $V_{DD}$ applied to its source, its drain connected to the transistor $M_{P2}$ gate, and its gate connected to the transistor $M_{P2}$ drain. The transistor $M_{P2}$ has a 3.3 V supply voltage $V_{DD}$ applied to its source, and the output signal $S_{OUT}$ with amplitude of 3.3 V is output from its drain. The transistor $M_{P1}$ has the input signal $S_{IN}$ applied to its gate, its drain connected to the transistor $M_{P1}$ drain, and its source connected to a ground. The transistor $M_{P2}$ has the inverted input signal $S_{INB}$ applied to its gate, its drain connected to the transistor $M_{P2}$ drain, and its source connected to a ground.

Next, the operation of the above-configured level shifter is described. To begin with, when the input signal $S_{IN}$ with a 2.5 V amplitude is at an "H" level, the transistor $M_{N1}$ turns on, and at the same time since the inverted input signal $S_{INB}$ becomes at an "L" level, the transistor $M_{N2}$ turns off. Accordingly, the transistor $M_{P2}$ turns on whereas the transistor $M_{P1}$ turns off. Therefore, the "H" level output signal $S_{OUT}$ of 3.3 V amplitude is output from this level shifter.

In contrast, when the input signal $S_{IN}$ is at the "L" level, the transistor $M_{N1}$ turns off, and at the same time since the inverted input signal $S_{INB}$ becomes the "H" level, the transistor $M_{N2}$ turns on. Accordingly, the transistor $M_{P2}$ turns off whereas the transistor $M_{P1}$ turns on. Therefore, the "L" level output signal $S_{OUT}$ is output from this level shifter.

It should be noted that disclosed in Japanese Patent Application Laid-open No. Hei 11-239051 is a conventional negative logic level shifter where the output signal $S_{OUT}$ differs from the configuration described above.

The conventional level shifter mentioned above operates normally when the "H" level of the inverted input signal $S_{INB}$ is substantially higher than the threshold voltage Vt (typically 0.7 V) of the transistor $M_{N2}$ gate voltage, and the resistance between the source and the drain of the off transistor $M_{P2}$ is sufficiently smaller than that of the on transistor $M_{N2}$. However, since the transistors $M_{N1}$ and $M_{N2}$ are not fully turned on when the "H" level of the inverted input signal $S_{INB}$ drops until near the threshold voltage Vt of the transistor $M_{N2}$ gate voltage, the resistance between the source and the drain of the transistor $M_{N2}$ that is insufficiently turned on abruptly increases to a value matching that of the Off transistor $M_{P2}$, whereby driving the subsequent transistors $M_{P1}$ and $M_{P2}$ is no longer possible. As a result, even when the input signal $S_{IN}$ is at the "L" level, the output signal $S_{OUT}$ stays at the "L" level, namely it can no longer decrease to 0 V, where the level shifter is unable to operate normally.

Input and output waveforms and voltages are described based on FIG. 25 through FIG. 30. It should be noted that in FIG. 25 through FIG. 30, the vertical axis represents input signal voltage (V) and the horizontal axis represents time (nS (nanoseconds)). Furthermore, the gate width of the transistors $M_{P1}$ and $M_{P2}$ is set as 10 μm and the gate width of the transistors $M_{N1}$ and $M_{N2}$ is set as 30 μm.

It can be understood from the waveform of FIG. 25 that with an input signal amplitude up to 2.0 V, level shifting to 3.3 V is possible without any change in the duty ratio. From the waveforms of FIG. 26 and FIG. 28, however, it can be understood that the duty ratio cannot be maintained regardless that level shifting has been performed as the input voltage drops from 1.5 V to 1.35 V.

Moreover, when the input signal voltage drops and becomes 1.2 V and 1.0 V, the output signals change at only near 3 V as illustrated in FIG. 29 and FIG. 30, respectively. In other words, the output signals no longer drop to 0 V. As a result, it is the same as if the level shifter actually outputs an "H" level signal, thereby becoming unable to transmit the input signal changes to the subsequent circuit.

Furthermore, with a first level shifter, it is evident that it takes long for the output signal to change and the level to reach a stable level since the input signal has changed, in other words, the response speed is slow, and particularly the slower as the input voltage drops more. For example, when the input signal is 2.0 V, as illustrated in FIG. 25, approximately 0.5 nanoseconds has lapsed from the time when the input signal begins rising to when the output voltage reaches a stable level; however, it is evident that when the input signal is 1.4 V, as illustrated in FIG. 27, approximately 1.5 nanoseconds has lapsed from the time when the input signal begins rising to when the output voltage reaches a stable level.

Moreover, since the transistors $M_{N1}$ and $M_{N2}$ are driven in the non-saturation region (insufficient ON state), if noise is superimposed at the input signal $S_{IN}$ and/or ground lines, resistance between the sources and drains of the transistors $M_{N1}$ and $M_{N2}$ abruptly fluctuates. As a result, there are cases where the ON-current widely varies and the capability of driving the subsequent transistors $M_{P1}$ and $M_{P2}$ is hindered. In this case, the waveform of the output signal $S_{OUT}$ becomes significantly irregular.

Furthermore, since the transistors $M_{N1}$ and $M_{N2}$ are driven in the non-saturation region, the ON-current values thereof are extremely small. As a result, it takes time for the gates of the subsequent transistors $M_{P1}$ and $M_{P2}$ to charge and discharge, and also to reach a stable level for the output signal $S_{OUT}$ potential since the input signal $S_{IN}$ is asserted from "L" level to "H" level or deasserted from "H" level to "L" level. Accordingly, the maximum frequency of the signal that is capable of operating the level shifter of this example becomes limited. Furthermore, during the transition period from when the input signal $S_{IN}$ has changed to when $S_{OUT}$ reaches a stable level, both the transistors $M_{P1}$ and $M_{N1}$ are not off, or both the transistors $M_{P2}$ and $M_{N2}$ are not off. Therefore, a large current, namely a flow-through current flows from the supply voltage VDD to the ground GND via the transistors $M_{P1}$ and $M_{N1}$ or the transistors $M_{P2}$ and $M_{N2}$. Consequently, the fact that it takes time to reach a stable level for the output signal $S_{OUT}$ potential since the input signal $S_{IN}$ is asserted or deasserted namely the transition time is long means that the time of the flow-through current flowing is long, causing power consumption to increase.

In this regard, as illustrated in FIG. 37, it can be understood from the waveform of the power supply current supplied to the first level shifter that a current continually flows during the period from when the input signal has changed to when the output signal reaches a stable level, and it can also be understood from the fact that the consumed power is determined from the amount and flowing period of the current that the first level shifter requires a large amount of power. It should be noted that the power supply current waveform of FIG. 37 is used as an example of one with an input signal of 1.4 V for the first level shifter. Furthermore, the power supply current waveform graph applies input voltage V to the left side vertical axis, time nS (nanoseconds) to the horizontal axis, and current mA to the right side vertical axis, as with the graphs in FIG. 38 to FIG. 40.

BRIEF SUMMARY OF THE INVENTION

Object of the Invention

The present invention accordingly aims to provide a level shifter, which is tolerant to noise and operates with low power consumption at a high operating frequency even in the case where difference in voltage amplitude between the input signal and the output signal is large or that level shifter operates near the transistor threshold voltage, and a semiconductor integrated circuit and an information processing system thereof.

Summary of the Invention

The level shifter of the present invention includes a first transistor of a first conduction type, which is connected between a first power supply line and a first node, has a control terminal connected to an input terminal to which an input signal is to be applied; a second transistor of a second conduction type, which is connected between a second power supply line and the first node, has a control terminal connected to an output terminal; an inverter, which is connected between the input terminal and a second node; a third transistor of the first conduction type, which is connected between the first power supply line and the output terminal, has a control terminal connected to the second node; a fourth transistor of the second conduction type, which is connected between the second power supply line and the output terminal, has a control terminal connected to the first node; and a fifth transistor of the second conduction type, which is connected between the second power supply line and the first node, has a control terminal connected to the input terminal.

In this manner, the level shifter of the present invention, by including the fifth transistor, is capable of quickly charging the first node when the input is at the "L" level.

Moreover, the level shifter of the present invention further includes a sixth transistor of the second conduction type, which is connected between the second power supply line and the output terminal, has a control terminal connected to the second node.

In this manner, the level shifter of the present invention, with the sixth transistor, is capable of quickly charging the output terminal when the input signal is at the "H" level.

Further, the level shifter of the present invention further includes a seventh transistor of the first conduction type, which is connected between the first power supply line and the output terminal, has a control terminal connected to the first node; and an eighth transistor of the first conduction type, which is connected between the first power supply line and the first node, has a control terminal connected to the output terminal.

In this manner, the level shifter of the present invention, with the seventh and the eighth transistors, is capable of quickly charging the first node when the input signal is at the "H" level, and quickly charging the output terminal when the input signal is at the "L" level.

The level shifter of the present invention includes a first transistor of a first conduction type, which is connected between a first power supply line and a first node, has a control terminal connected to an input terminal to which an input signal is to be applied; a second transistor of a second conduction type, which is connected between the first node and a second power supply line, has a control terminal connected to an output terminal; an inverter, which is connected between the input terminal and a second node; a third transistor of the first conduction type, which is connected between the first power supply line and the output terminal, has a control terminal connected to the second node; a fourth transistor of the second conduction type, which is connected between the second power supply line and the output terminal, has a control terminal connected to the first node; a fifth transistor of the first conduction type, which is connected between the first power supply line and the first node, has a control terminal connected to the output terminal; a sixth transistor of the second conduction type, which is connected between the second power supply line and a third node, has a control terminal connected to the input terminal; a seventh transistor of the first conduction type, which is connected between the first node and the third node, has a control terminal connected to the first node; an eighth transistor of the first conduction type, which is connected between the first power supply line and the output terminal, has a control terminal connected to the first node; a ninth transistor of the second conduction type, which is connected between the second power supply line and a fourth node, has a control terminal connected to the second node; and a tenth transistor of the first conduction type, which is connected between the fourth node and the output terminal, has a control terminal connected to the output terminal.

Moreover, the level shifter of the present invention further includes an eleventh transistor of the second conduction type, which is connected between the first transistor and the third node as a substitute for the seventh transistor, has a control terminal connected to the output terminal; and a twelfth transistor of the second conduction type, which is connected between the fourth node and the output terminal as a substitute for the tenth transistor, has a control terminal connected to the first node.

In this manner, including the ninth, the tenth, the eleventh, and the twelfth transistors, allows preventing flow-through current and reducing power consumption.

BRIEF DESCRIPTION OF THE DRAWINGS

FIG. 2 is a diagram illustrating an example of an input signal $S_{IN}$ waveform;

FIG. 3 is a diagram illustrating an example of an inverted input signal $S_{INB}$ waveform;

FIG. 4 is a diagram for describing the independent operation of a first level shifter 1 that configures the level shifter;

FIG. 5 is a diagram illustrating an example of an output signal $S_{OUT}$ waveform in the case where the first level shifter 1 independently operates;

FIG. 6 is a diagram for describing the independent operation of a second level shifter 2 that configures the level shifter;

FIG. 7 is a diagram illustrating an example of an output signal $S_{OUT}$ waveform in the case where the second level shifter 2 independently operates;

DETAILED DESCRIPTION OF THE PREFERRED EMBODIMENTS

Hereafter, the preferred embodiments of the present invention are described with reference to the drawings. The description is carried out in detail through embodiments.

A. First Embodiment

Figure 1:
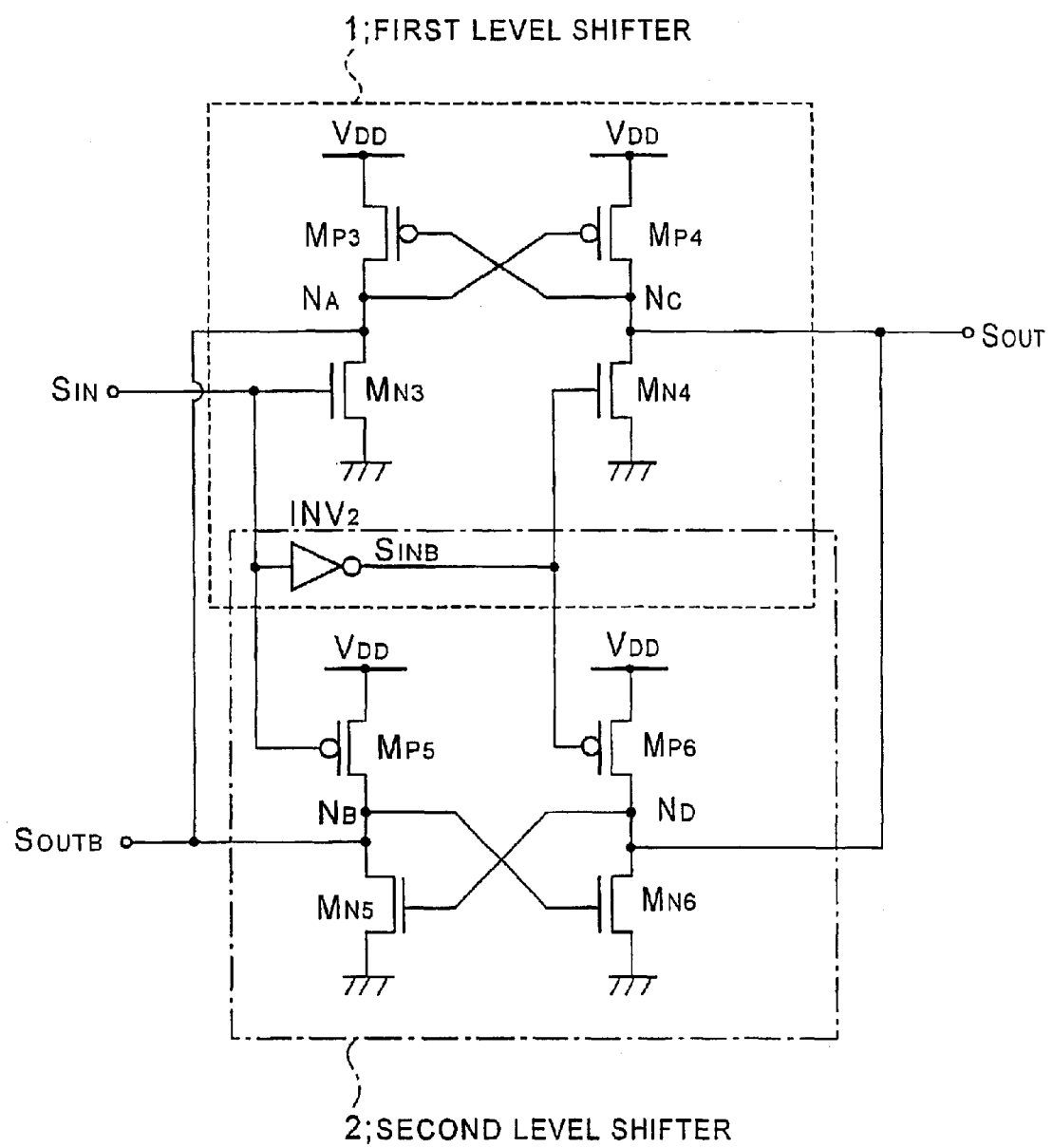
FIG. 1 is a circuit diagram illustrating the configuration of a level shifter, which is a first embodiment of the present invention.
Figure 8:
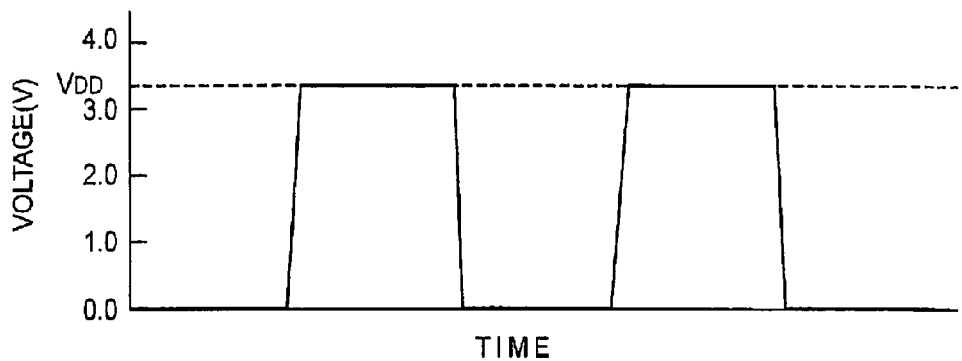
FIG. 8 is a diagram illustrating an example of an output signal $S_{OUT}$ waveform in the case where the level shifter operates.
Figure 9:
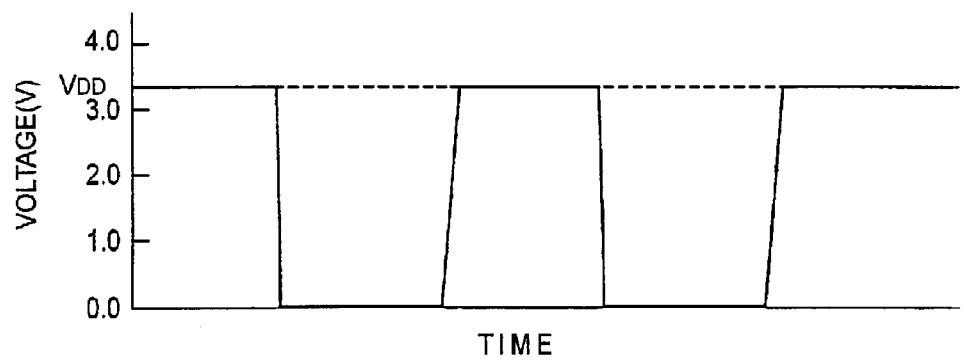
FIG. 9 is a diagram illustrating an example of an inverted output signal $S_{OUTB}$ waveform in the case where the level shifter operates.
Figure 10:
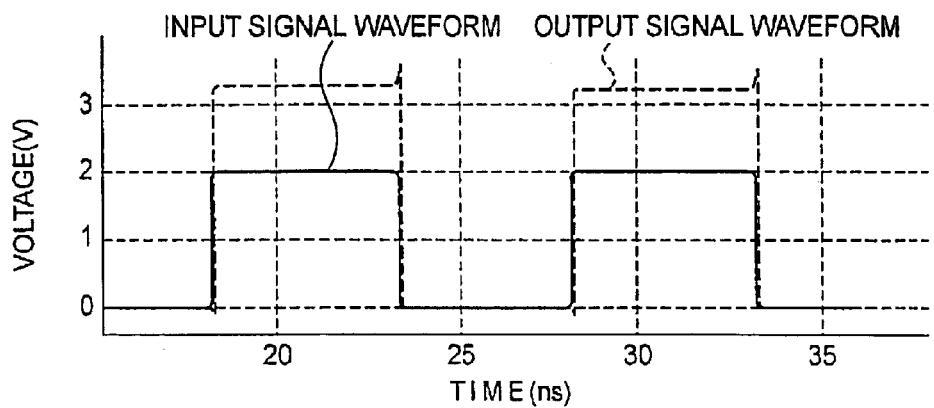
FIG. 10 is an input/output waveform graph at the time of a 2.0 V input voltage according to the first embodiment of the present invention.

To begin with, the first embodiment of the present invention is described while referencing FIG. 1.

The level shifter of the first embodiment is one that level-converts a 1.2 V amplitude input signal $S_{IN}$ to the level of a 3.3 V amplitude positive logic output signal $S_{OUT}$ and a 3.3 V amplitude negative logic output signal $S_{OUTB}$. The level shifter of this example is configured from a first level shifter 1 and a second level shifter 2, where node $N_A$ and node $N_B$ in the first level shifter 1 and second level shifter 2, respectively, which are described later, are connected together, and later described node $N_C$ and node $N_D$ are also connected together.

The first level shifter 1 is configured from an inverter $INV_2$, 3.3 V-tolerant P-channel transistors $M_{P3}$ and $M_{P4}$, and 3.3 V-tolerant N-channel transistors $M_{N3}$ and $M_{N4}$.

The inverter $INV_2$ has a CMOS structure, which is configured from a P-channel and an N-channel transistor that are connected between the ground and the power supply of a 1.2 V supply voltage, and inverts the 1.2 V amplitude input signal $S_{IN}$ so as to output an inverted input signal $S_{INB}$ with an amplitude of 1.2 V. The transistor $M_{P3}$ has a 3.3 V supply voltage $V_{DD}$ applied to its source, its drain connected to the transistor $M_{P4}$ drain, and its gate connected to the transistor $M_{P4}$ drain, where a 3.3 V amplitude negative logic output signal $S_{OUTB}$ is output from its drain. The transistor $M_{P4}$ has a 3.3 V supply voltage $V_{DD}$ applied to its source, and a 3.3 V amplitude positive logic output signal $S_{OUT}$ is output from its drain.

The transistor $M_{N3}$ has the input signal $S_{IN}$ applied to its gate, its drain connected to the transistor $M_{P3}$ drain, and its source is grounded. The transistor $M_{N4}$ has the inverted input signal $S_{INB}$ applied to its gate, its drain connected to the transistor $M_{P4}$ drain, and its source is grounded. In other words, since the first level shifter 1 is provided with the N-channel transistors $M_{N3}$ and $M_{N4}$ in the input stage, and respective gates of the P-channel transistors $M_{P3}$ and $M_{P4}$ are connected to the other's drain, it can also be called an N-channel transistor input-type cross-connect circuit. The connecting point of the transistor $M_{P3}$ drain and the transistor $M_{N3}$ drain is the node $N_A$, and the connecting point of the transistor $M_{P4}$ drain and the transistor $M_{N4}$ drain is the node $N_C$.

The second level shifter 2 is configured from the inverter $INV_2$, 3.3 V-tolerant P-channel transistors $M_{P5}$ and $M_{P6}$, and 3.3 V-tolerant N-channel transistors $M_{N5}$ and $M_{N6}$.

The transistor $M_{P5}$ has the 3.3 V supply voltage $V_{DD}$ applied to its source, the input signal $S_{IN}$ applied to its gate, its drain is connected to the transistor $M_{N6}$ gate, and the 3.3 V amplitude negative logic output signal $S_{OUTB}$ is output from its drain. The transistor $M_{P6}$ has a 3.3 V supply voltage $V_{DD}$ applied to its source, the inverted input signal $S_{INB}$ applied to its gate, where its drain is connected to the transistor $M_{N5}$ gate.

The transistor $M_{N5}$ has its drain connected to the transistor $M_{P5}$ drain, its gate connected to the transistor $M_{P6}$ drain, and its source is grounded. The transistor $M_{N6}$ has its drain connected to the transistor $M_{P6}$ drain, its gate connected to the transistor $M_{P5}$ drain, and its source is grounded. In other words, since the second level shifter 2 is provided with the P-channel transistors $M_{P5}$ and $M_{P6}$ at the input stage, and respective gates of the N-channel transistors $M_{N5}$ and $M_{N6}$ are connected to the other's drain, it can also be called a P-channel transistor input-type cross-connect circuit. The connecting point of the transistor $M_{P5}$ drain and the transistor $M_{N5}$ drain is the node $N_B$, and the connecting point of the transistor $M_{P6}$ drain and the transistor $M_{N6}$ drain is the node $N_D$.

It should be noted that the threshold voltage Vt for the gate voltages of the transistors $M_{P3}$ through $M_{P6}$ and $M_{N3}$ through $M_{N6}$ is assumed to be 0.7 V.

Next, the operation of the above-configured level shifter is described. To begin with, the independent operation of the first level shifter 1 in the case where the input signal $S_{IN}$ having the waveform given in FIG. 2 is input is described while referencing FIG. 3 through FIG. 5.

To begin with, when the input signal $S_{IN}$ is at the 'H' level (which corresponds to a voltage $V_H$, hereafter) where the signal amplitude is 1.2 V, the amplitude of 1.2 V is only 0.5 V higher than the threshold voltage Vt (0.7 V) for the transistor $M_{N3}$. At this time, the transistor $M_{N3}$ is slightly turning on or it operates in the non-saturation region (linear region). In other words, the transistor $M_{N3}$ operates with very low drive capability. The transistor $M_{N3}$ thus cannot fully turn on, and operates as a high impedance device (or operates in a high impedance state).

Therefore, the potential at the node $N_A$ shown in FIG. 1 does not perfectly reach 0 V (GND), ultimately becoming an intermediate potential (referred to as intermediate potential $V_{M1}$ hereafter) between 0 V and the supply voltage $V_{DD}$ (3.3 V) determined based on the high impedance state resistance ratio of the resistance between the source and the drain of the transistor $M_{N3}$ and the OFF state (described later) resistance between the source and the drain of the transistor $M_{P3}$. Accordingly, the transistor $M_{P4}$ is applied the above intermediate potential $V_{M1}$ to its gate, thereby gradually changing into an ON state, and the potential at the node $N_C$, which is an output end, gradually changes into the supply voltage $V_{DD}$ (3.3 V). Here, setting the resistance between the source and the drain of the high impedance state transistor $M_{N3}$ as resistance $R_{N3}$ and the resistance between the source and the drain of the Off transistor $M_{P3}$ as $R_{P3}$, the above intermediate potential $V_{M1}$ is represented by equation (1).

$$V_{M1} = (R_{N3} \times V_{DD})/(R_{N3} + R_{P3}) \tag{1}$$

The input signal $S_{IN}$ is the potential $V_H$, and thus the inverted input signal $S_{INB}$, as illustrated in FIG. 3, is at the "L" level (referred to as potential $V_L$ hereafter), in this case, is 0 V. Accordingly, the transistor $M_{N4}$ is applied the above potential $V_L$ to its gate, thereby is fully turned off, allowing the potential at the node $N_C$ in FIG. 1 to continuously rise until reaching the supply voltage $V_{DD}$ (3.3 V) in accordance with transistor $M_{P4}$ operation. It should be noted that since the transistor $M_{P4}$, as mentioned above, operates due to the intermediate potential $V_{M1}$ being applied to its gate, it does not sufficiently turn on, and has resistance between the source and the drain (low impedance state). However, since the resistance between the source and the drain of the transistor $M_{P4}$ is substantially lower than that between the source and the drain of the fully off transistor $M_{N4}$, the potential at the node $N_C$ continuously rises until nearly reaching the supply voltage $V_{DD}$ (3.3 V). In this manner, since the node $N_C$ potential continues to rise until nearly reaching the supply voltage $V_{DD}$ (3.3 V), the transistor $M_{P3}$, which has the potential of this node $N_C$ applied to its gate, ultimately turns off.

In contrast, when the input signal $S_{IN}$ is the potential $V_L$, as illustrated in FIG. 3, the inverted input signal $S_{INB}$ becomes the potential $V_H$. Accordingly, as with the transistor $M_{N3}$ in the case where the above input signal $S_{IN}$ is the potential $V_H$, the transistor $M_{N4}$ operates in the non-saturation region (linear region) In other words, the transistor $M_{N4}$ operates with very low drive capability. The transistor $M_{N4}$ thus cannot fully turn on, and operates as a high impedance device (or operates in a high impedance state).

Therefore, the potential at the node $N_C$, which is an output end shown in FIG. 1, does not perfectly reach 0 V, ultimately becoming an intermediate potential (referred to as intermediate potential $V_{M2}$ hereafter) between 0 V and the supply voltage $V_{DD}$ (3.3 V) determined based on the high impedance state resistance ratio of the resistance between the source and the drain of the transistor $M_{N4}$ and the Off resistance between the source and the drain of the transistor $M_{P4}$. Accordingly, the transistor $M_{P3}$ is applied the above intermediate potential $V_{M2}$ to its gate, thereby gradually altering into an ON state, and the potential at the node $N_A$ gradually changes to the supply voltage $V_{DD}$ (3.3 V). Here, setting the resistance between the source and the drain of the high impedance transistor $M_{N4}$ as resistance $R_{N4}$ and the resistance between the source and the drain of the Off transistor $M_{P4}$ as $R_{P4}$, the above intermediate potential $V_{M2}$ is represented by equation (2).

$$V_{M2}=(R_{N4} \times V_{DD})/(R_{N4}+R_{P4}) \quad (2)$$

Since the input signal $S_{IN}$ is the potential $V_L$, the transistor $M_{N3}$ fully turns off, allowing the potential at the node $N_A$ illustrated in FIG. 1 to continuously rise until reaching the supply voltage $V_{DD}$ (3.3 V). It should be noted that since the transistor $M_{P3}$, as mentioned above, operates due to the potential $V_{M2}$ being applied to its gate, it does not sufficiently turn on and has resistance between the source and the drain. However, since the resistance between the source and the drain of the low impedance state transistor $M_{P3}$ is substantially lower than that between the source and the drain of the full off transistor $M_{N3}$, the potential at the node $N_A$ continuously rises until nearly reaching the supply voltage $V_{DD}$ (3.3 V). In this manner, since the node $N_A$ potential continues to rise until nearly reaching the supply voltage $V_{DD}$ (3.3 V), the transistor $M_{P4}$, which has the potential of this node $N_A$ applied to its gate, ultimately turns off.

Organizing the independent operation of the first level shifter 1 described above results in the table given in FIG. 4, and the output signal $S_{OUT}$ waveform is as illustrated in FIG. 5.

In this manner, when the first level shifter 1 has independently operated, there is the advantage that the output signal $S_{OUT}$ potential rises until nearly reaching the supply voltage $V_{DD}$ (3.3 V) when the input signal $S_{IN}$ is the potential $V_H$. On the other hand, there is the disadvantage that the output signal $S_{OUT}$ potential does not drop to 0 V when the input signal $S_{IN}$ is the potential $V_L$.

It should be noted that the relationship between the input/output waveforms of the first level shifter 1 and the input voltage is as described with the prior art and is as illustrated in FIG. 25 through FIG. 30.

Next, the independent operation of the second level shifter 2 in the case where the input signal $S_{IN}$ having the waveform given in FIG. 2 is input is described while referencing FIG. 6 and FIG. 7.

To begin with, when the input signal $S_{IN}$ is the potential $V_H$, since the amplitude of 1.2 V is 0.5 V higher than the threshold voltage Vt (0.7 V) of the transistor $M_{P5}$ gate voltage, the absolute value of the potential difference between the drain and the gate is 3.3 V−1.2 V=2.1 V and 2.1 V>0.7 V. At this time, the transistor $M_{P5}$ does not fully turn off but nearly turns on. Thus, the transistor $M_{P5}$ operates as a low impedance device (or operates in a low impedance state).

Meanwhile, since the input signal $S_{IN}$ is the potential $V_H$, the inverted input signal $S_{INB}$ becomes the potential $V_L$ (0 V (GND), as illustrated in FIG. 3. The transistor $M_{P6}$ is applied the above potential $V_L$ to its gate, thereby fully turns on, and operates to make the potential at the node $N_D$, which is an output end, suddenly increase to the supply voltage $V_{DD}$ (3.3 V). Accordingly, since the transistor $M_{N5}$ has applied to its gate a sufficiently high voltage that is close to the supply voltage $V_{DD}$, it nearly turns on and operates to make the potential at the node $N_B$, which is an inverted output end, suddenly drop to 0 V.

However, as described above, since the transistor $M_{P5}$ is not fully off, the potential at the node $N_B$ shown in FIG. 1 does not perfectly reach 0 V, and ultimately becomes an intermediate potential (referred to as potential $V_{M31}$ hereafter) between 0 V and the supply voltage $V_{DD}$ (3.3 V) determined based on the resistance ratio of the resistance between the source and the drain of the low impedance state transistor $M_{P5}$ and resistance between the source and the drain of the ON state transistor $M_{N5}$. Here, setting the resistance between the source and the drain of the low impedance state transistor $M_{P5}$ as resistance $R_{P51}$ and the resistance between the source and the drain of the ON state transistor $M_{N5}$ as $R_{N51}$, the above intermediate potential $V_{M31}$ is represented by equation (3).

$$V_{M31}=(R_{N51} \times V_{DD})/(R_{P51}+R_{N51}) \quad (3)$$

In practice, since the resistance between the source and the drain of the nearly on transistor $M_{N5}$ is substantially lower than resistance between the source and the drain of the low impedance state transistor $M_{P5}$, the potential at the node $N_B$ drops near 0 V. In this manner, since the node $N_B$ potential drops near 0 V, the transistor $M_{N6}$, which has the potential of this node $N_B$ applied to its gate, nearly turns off (or enters a high impedance state). As a result, the ON state of the transistor $M_{P6}$ is predominant over the high impedance state of the transistor $M_{N6}$, which assists the potential at the node $N_D$, which is an output end, to increase up to the supply voltage $V_{DD}$ (3.3 V.) Here, the potential at the node $N_D$ in the case where the resistance between the source and the drain of the on transistor $M_{P6}$ is set as resistance $R_{P61}$ and resistance between the source and the drain of the low impedance state transistor $M_{N6}$ is set as $R_{N61}$ is represented by equation (4) as intermediate potential $V_{M41}$.

$$V_{M41}=(R_{N61} \times V_{DD})/(R_{P61}+R_{N61}) \quad (4)$$

In contrast, when the input signal $S_{IN}$ is the potential $V_L$, since 0 V (GND) is applied to the gate, the transistor $M_{P5}$ fully turns on. Accordingly, since the transistor $M_{N6}$ has applied to its gate a voltage that is near the supply voltage VDD, it nearly turns on, making the potential at the node $N_D$, which is an output end, suddenly drop to 0 V. Meanwhile, since the input signal $S_{IN}$ is the potential $V_L$, the inverted input signal $S_{INB}$ becomes the potential $V_H$ (1.20 V), as illustrated in FIG. 3. Since the absolute value of the potential difference between the drain and the gate is 3.3 V−1. 2 V=2.1 V and 2.1 V>0.7 V, the transistor $M_{P6}$ does not fully turn off but nearly turns on. In other words, the transistor $M_{P6}$ is nearly off. Thus, the transistor $M_{P6}$ operates as a low impedance device (or operates in a low impedance state). Therefore, the potential at the node $N_D$, which is an output end, does not perfectly reach 0 V, ultimately becoming an intermediate potential (referred to as intermediate potential $V_{M42}$ hereafter) between 0 V and the supply voltage $V_{DD}$ (3.3 V) determined based on the ratio of the resistance between the source and the drain of the low impedance state transistor $M_{P6}$ and resistance between the source and the drain of the nearly on transistor $M_{N6}$. Here, setting the resistance between the source and the drain of the low impedance state transistor $M_{P6}$ as resistance $R_{P62}$ and the resistance between the source and the drain of the nearly on transistor $M_{N6}$ as $R_{N62}$, the above intermediate potential $V_{M42}$ is represented by equation (5).

$$V_{M42}=(R_{N62} \times V_{DD})/(R_{P62}+R_{N62}) \qquad (5)$$

In practice, since the resistance between the source and the drain of the nearly on transistor $M_{N6}$ is substantially lower than the resistance between the source and the drain of the low impedance state transistor $M_{P6}$, the potential at the node $N_D$ drops close to 0 V. In this manner, since the potential at the node $N_D$ drops close to 0 V, the transistor $M_{N5}$, which has the potential of this node $N_D$ applied to its gate, it nearly turns off (or enters a high impedance state). As a result, since the ON state of the transistor $M_{P5}$ is predominant over the high impedance state of the transistor $M_{N5}$, the potential at the node $N_B$, which is an inverted output end, suddenly increases up to the supply voltage $V_{DD}$ (3.3 V). Here, the potential at the node $N_B$ in the case where the resistance between the source and the drain of the ON state transistor $M_{P5}$ is set as resistance $R_{P52}$ and the resistance between the source and the drain of the low impedance state transistor $M_{N5}$ is set as $R_{N52}$ is represented by equation (6) as intermediate potential $V_{M32}$.

$$V_{M32}=(R_{N52} \times V_{DD})/(R_{P52}+R_{N52}) \qquad (6)$$

Organizing the independent operation of the second level shifter 2 described above results in the table given in FIG. 6, and the output signal $S_{OUT}$ waveform of this case is as illustrated in FIG. 7.

In this manner, when the second level shifter 2 has independently operated, there is the advantage that input/output response is extremely fast since the node $N_B$, which is an output end, is driven by the transistors $M_{P6}$ or $M_{N6}$ that always has sufficient drive capability. On the other hand, there is the disadvantage that the output signal $S_{OUT}$ potential does not rise to the supply voltage $V_{DD}$ (3.3 V) when the input signal $S_{IN}$ is the potential $V_H$, and the output signal $S_{OUT}$ potential does not drop to 0 V when the input signal $S_{IN}$ is the potential $V_L$.

The relationship between the input and output signal waveforms and voltage of the first level shifter 2 is given in FIG. 31 through FIG. 36. It should be noted that in FIG. 31 through FIG. 36, the vertical axis is set as the input signal voltage (V) and the horizontal axis as time (nS (nanoseconds)). Furthermore, the gate width of the transistors $M_{P5}$ and $M_{P6}$ is set as 20 μm and the gate width of the transistors $M_{N5}$ and $M_{N6}$ is set as 10 μm.

Figure 31:
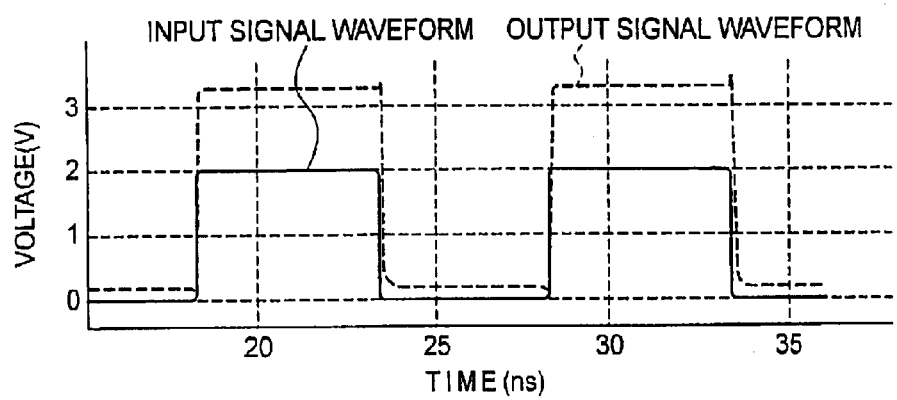
FIG. 31 is an input/output waveform graph at the time of a 2.0 V input voltage according to the second level shifter.
Figure 32:
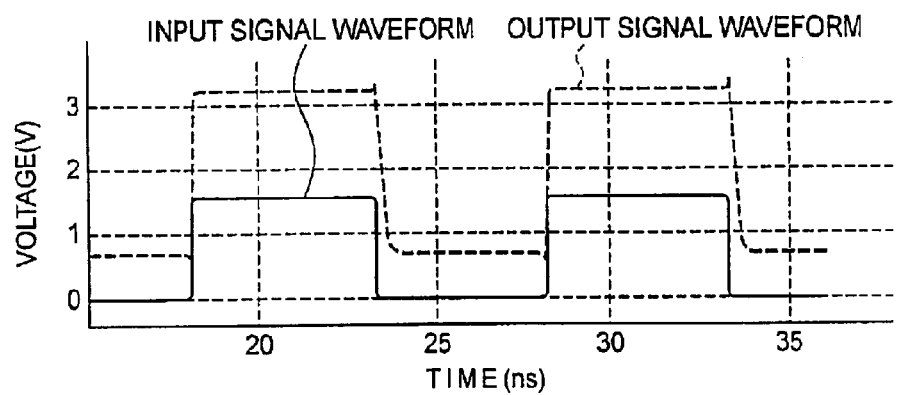
FIG. 32 is an input/output waveform graph at the time of a 1.5 V input voltage according to the second level shifter.

With the second level shifter, it can be understood from the waveform in FIG. 31 that when the input voltage is 2.0 V, the already established output signal "L" level floats up at 0.2 V instead of at GND (0 V). It can be understood from FIG. 31 through FIG. 36 that this "float" of the output signal "L" level becomes more evident as the input voltage decreases, and that the "L" level of the output signal increases to approximately 2.6 V when the input voltage is 1.0 V.

Figure 34:
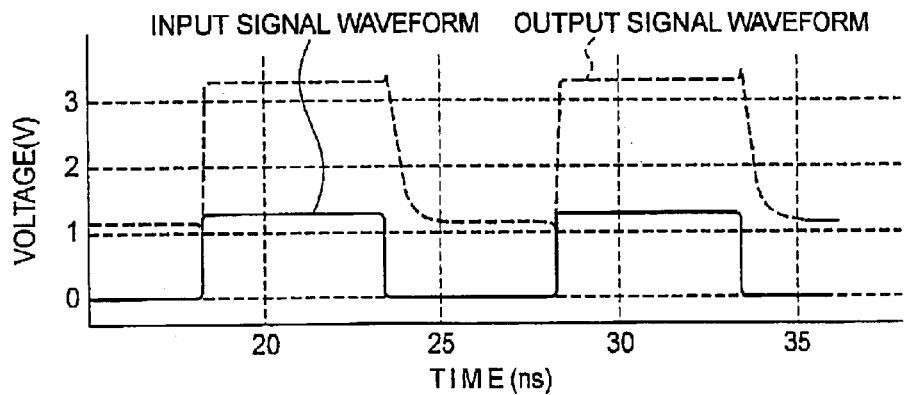
FIG. 34 is an input/output waveform graph at the time of a 1.3 V input voltage according to the second level shifter.
Figure 35:
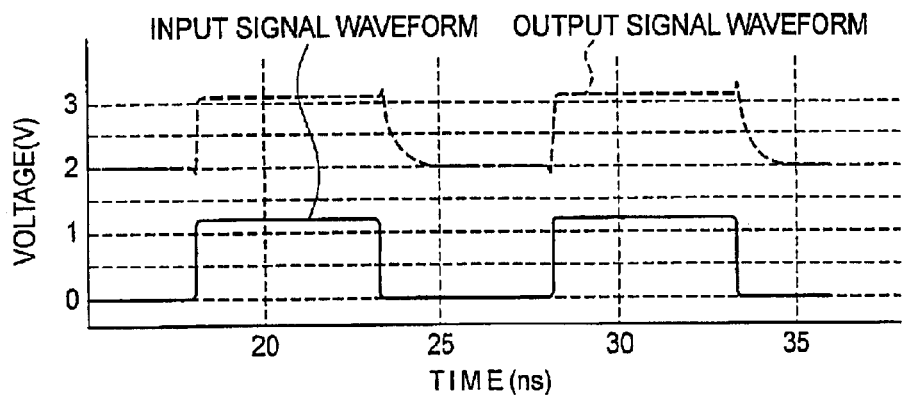
FIG. 35 is an input/output waveform graph at the time of a 1.2 V input voltage according to the second level shifter.
Figure 36:
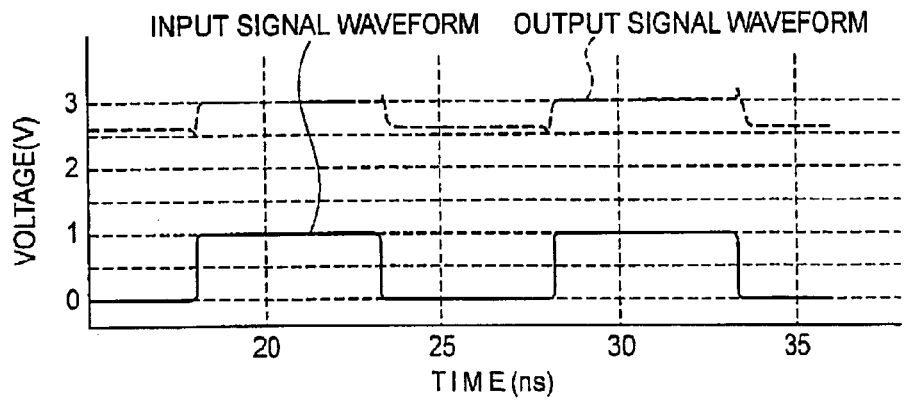
FIG. 36 is an input/output waveform graph at the time of a 1.0 V input voltage according to the second level shifter.

Furthermore, it can be understood from the waveforms in FIG. 34 through FIG. 36 that the "H" level of the output voltage drops from 3.3 V when the input signal is 1.3 V or lower, and drops to approximately 3.0 V when the input signal is 1.0 V.

It can further be understood from the waveform graphs in FIG. 31 through FIG. 36 that the second level shifter changes the output signal corresponding to the level change of the input signal, thereby having good tracking capability.

Figure 33:
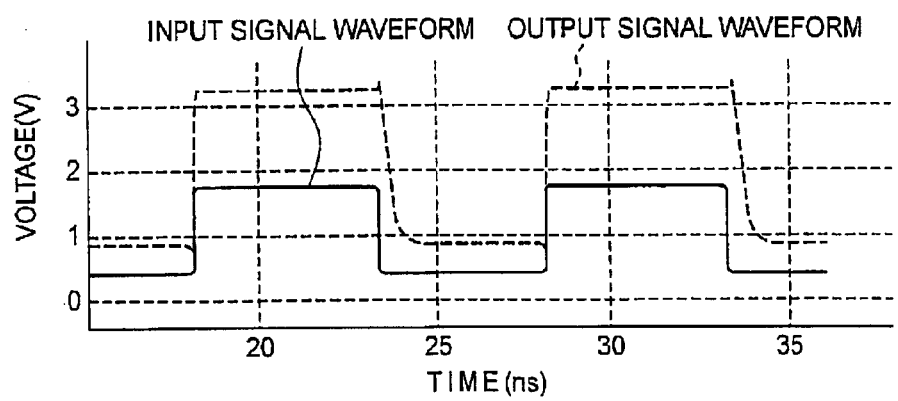
FIG. 33 is an input/output waveform graph at the time of a 1.4 V input voltage according to the second level shifter.

For example, when the input signal is 2.0 V, as illustrated in FIG. 31, the time from when the input signal is changed to when the output signal reaches a stable level is approximately 0.3 nanoseconds, and when the input signal is 1.4 V, as illustrated in FIG. 33, the time from when the input signal is changed to when the output signal reaches a stable level is approximately 0.5 nanoseconds. Accordingly, it can be understood that the period until the output signal reaches a stable level in response to the input signal change is shorter for the second level shifter than for the first level shifter.

Figure 38:
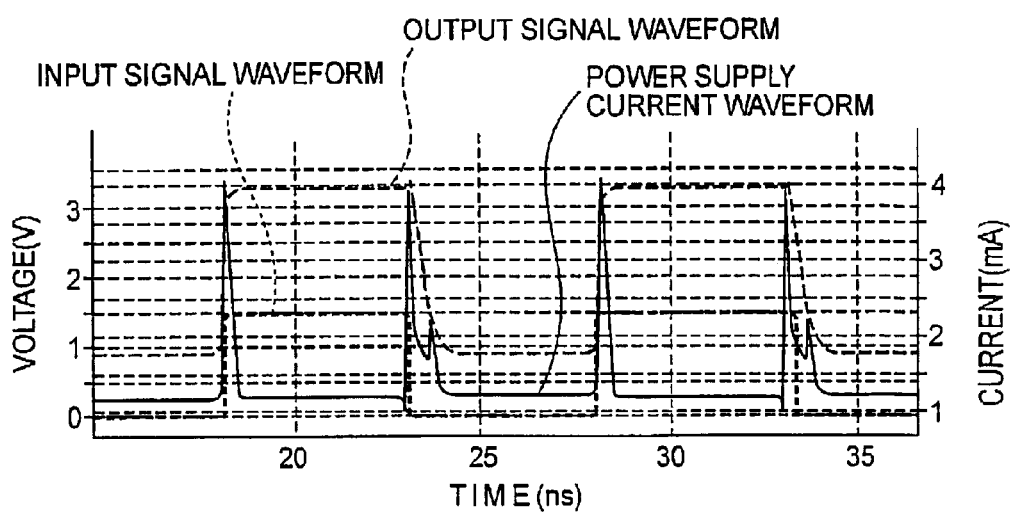
FIG. 38 is a power supply current waveform graph at the time of a 1.4 V input voltage according to the second level shifter.

Accordingly, as shown in FIG. 38, the power supply current waveform of the second level shifter circuit is a waveform such that it rises for just a short period, however, it can be understood that since a flow-through current constantly flows through the transistors $M_{P5}$ and $M_{N5}$ or the transistors $M_{P6}$ and $M_{N6}$, a current of approximately 1.25 mA continuously flows even in locations without signal changes. It should be noted that the power supply current waveform graph of FIG. 38 is used as an example of one with an input signal of 1.4 V for the second level shifter.

In this manner, the first level shifter 1 and second level shifter 2 have the above advantages and disadvantages when each are utilized independently. Accordingly, the level shifter of this example is configured with the first level shifter 1 and second level shifter 2 where the node $N_A$ and node $N_B$, and node $N_C$ and $N_D$ are connected to each other, respectively, so as to make the first level shifter 1 and second level shifter 2 operate to draw on each other's advantages while covering each other's shortcomings and provide the desired functions.

Hereafter, the operation of the level shifter of this example in which the first level shifter 1 and second level shifter 2 are connected is described while referencing FIG. 1 through FIG. 4, FIG. 6, FIG. 8 and FIG. 9.

(1) A case where the input signal $S_{IN}$ potential changes from the potential $V_L$, to the potential $V_H$ (see FIG. 2)

In this case, the potential $V_H$ (1.2 V) of the input signal $S_{IN}$ is applied to the respective gates of the transistors $M_{N3}$ and $M_{P5}$. As described above (see FIG. 4), the transistor $M_{N3}$ is not fully in an ON state but in a high impedance state. As a result, the transistor $M_{N3}$ operates so as to make the gate voltage of the transistor $M_{P4}$, potential at the node $N_A$ and potential at the node $N_B$, which is connected to the node $N_A$, gradually decrease to 0 V. Furthermore, the transistor $M_{P5}$ is not fully in an OFF state but in a low impedance state, as described above (see FIG. 6), even if the input signal $S_{IN}$ potential $V_H$ (1.2 V) is applied to its gate.

Meanwhile, since the input signal $S_{IN}$ is the potential $V_H$, the inverted input signal $S_{INB}$ becomes the potential $V_L$ (0 V (GND), as illustrated in FIG. 3, and the above potential $V_L$ is then applied to the respective gates of the transistors $M_{N4}$ and $M_{P6}$. Accordingly, as described above (see FIG. 4 and FIG. 6), the transistor $M_{N4}$ is fully turned off as well as the transistor $M_{N4}$ is fully turned on. Due to the transistor MP6 being fully turned on, the potential at the node $N_D$, which is an output end, namely the potential of the output signal $S_{OUT}$ suddenly increases up to the supply voltage $V_{DD}$ (3.3 V), reaching a logic "H" level. At the same time, the transistor $M_{N5}$ fully turns on since the supply voltage (3.3 V) is applied to its gate (see FIG. 6). Accordingly, the potential at the node $N_B$, which is an inverted output end from where the inverted output signal $S_{OUTB}$ is to be output, suddenly changes to 0 V, where as a result, the transistor $M_{N5}$ serves as a supplement to the transistor $M_{N3}$ operation of lowering the potential at the node $N_B$ to 0 V. Furthermore, due to the transistor $M_{N5}$ being fully on, 0 V is applied to the gate of the transistor $M_{N6}$, therefore the transistor $M_{N6}$ fully turns off.

Through the operation described above, the logic level at the node $N_B$ reaches the "L" level (0 V).

When the logic level at the node $N_B$ reaches the "L" level (0 V), this signal is returned to the node $N_A$, which is the other inverted output end connected to the node $N_B$, therefore the transistor $M_{P4}$, which has this "L" level (0 V) applied to the gate, suddenly turns on, causing the potential at the node $N_C$, which is an output end, to suddenly increase to the supply voltage (3.3 V). This operation that suddenly turns on the transistor $M_{P4}$ causes the potential at the node $N_D$ that is connected to the node $N_C$, namely the potential of the output signal $S_{OUT}$ to increase to the "H" level (3.3 V); this operation is being carried out as tracking transistor $M_{P6}$ operation. Accordingly, the transistor $M_{P3}$ becomes fully off since the "H" level (3.3 V) is applied to the gate connected to the node $N_C$, and supplements the transistor $M_{N3}$ operation of lowering to 0 V the potentials at the nodes $N_A$ and $N_B$, which are inverted output ends.

As described in the foregoing, the operation that fully puts the transistor $M_{P6}$ into the ON state triggers the other transistors to operate so as to establish in a chain reaction the potential logic levels at the respective drains, namely the output ends (nodes $N_C$ and $N_D$) and the inverted output ends (nodes $N_A$ and $N_B$). As a result, the output signal $S_{OUT}$ changes extremely quickly from 0 V to the supply voltage $V_{DD}$ (3.3 V).

(2) A case where the input signal $S_{IN}$ potential changes from the potential $V_H$ to the potential $V_L$ (see FIG. 2)

Since the input signal $S_{IN}$ is the potential $V_L$, the inverted input signal $S_{INB}$ becomes the potential $V_H$ (1.2 V) as illustrated in FIG. 3, and the above potential $V_H$ is then applied to the respective gates of the transistors $M_{N4}$ and $M_{P6}$. As described above (see FIG. 4), the transistor $M_{N4}$ does not fully turn on but enters a high impedance state. As a result, the transistor $M_{N4}$ operates so as to make the gate voltage of the transistor $M_{P3}$, the potential at the node $N_C$ and potential at the node $N_D$, which is connected to the node $N_C$, gradually decrease to 0 V. Furthermore, the transistor $M_{P6}$ does not fully turn off but enters a low impedance state, as described above (see FIG. 6), even if the input signal $S_{IN}$ potential $V_H$ (1.2 V) is applied to its gate.

In this case, however, the potential $V_L$ (0 V) of the input signal $S_{IN}$ is applied to the respective gates of the transistors $M_{N3}$ and $M_{P5}$. Accordingly, as described above (see FIG. 4 and FIG. 6), the transistor $M_{N3}$ fully turns off as well as the transistor $M_{P5}$ fully turns on. Due to the transistor $M_{P5}$ turning fully on, the potential at the node $N_B$, which is an inverted output end, namely the potential of the inverted output signal $S_{OUTB}$ suddenly changes up to the supply voltage $V_{DD}$ (3.3 V), reaching a logic "H" level. At the same time, the transistor $M_{N6}$ has the supply voltage (3.3 V) applied to its gate, thereby fully turns on (see FIG. 6). Accordingly, the potential at the node $N_D$, which is an output end from which the output signal $S_{OUT}$ is to be output, suddenly changes to 0 V, and as a result, the transistor $M_{N6}$ supplements the operation of the transistor $M_{N4}$ of lowering the node $N_D$ potential to 0 V. Furthermore, due to the transistor $M_{P5}$ turning fully on, 0 V is applied to the transistor $M_{N5}$ gate, whereby the transistor $M_{N5}$ fully turns off.

Through the operation described above, the logic level at the node $N_D$ reaches the "L" level (0 V).

When the logic level at the node $N_D$ reaches the "L" level (0 V), this signal is returned to the node $N_A$, which is the other inverted output end connected to the node $N_B$, therefore the transistor $M_{P4}$ that has this "L" level (0 V) applied to its gate suddenly turns on, causing the potential at the node $N_C$, which is an output end, to suddenly rise to the supply voltage (3.3 V). This operation that suddenly turns on the transistor $M_{P3}$ causes the potential at the node $N_B$ that is connected to the node $N_A$, namely the potential of the output signal $S_{OUT}$ to increase to the "H" level (3.3 V); this operation is being carried out as tracking transistor $M_{P5}$ operation. Accordingly, the transistor $M_{P4}$ fully turns off since the "H" level (3.3 V) is applied to the gate connected to the node $N_A$, and supplements the transistor $M_{N4}$ operation of lowering to 0 V the potentials at the nodes $N_C$ and $N_D$, which are inverted output ends.

As described in the foregoing, the operation that fully turns on the transistor $M_{P5}$ triggers the other transistors to operate so as to establish in a chain reaction the potential logic levels of the respective drains, namely the output ends (nodes $N_C$ and $N_D$) and the inverted output ends (nodes $N_A$ and $N_B$). As a result, the output signal $S_{OUT}$ changes extremely quickly from the supply voltage $V_{DD}$ (3.3 V) to 0 V (GND).

As described above, in the level shifter of this example, the second level shifter 2 has the potential $V_L$ (0 V) of the input signal $S_{IN}$ always applied to either the gate of the transistor $M_{N5}$ or the transistor $M_{P6}$. Accordingly, the transistor $M_{P5}$ or $M_{P6}$ applied with the potential $V_L$ (0 V) carries out a fast drive operation in the saturation region, operates to raise to the supply voltage (3.3 V) the potential at the output end (referred to as first output end for convenience), which is the drain end, and operate to lower to 0 V the potential at the output end (referred to as second output end for convenience), which is the drain end, of the other transistor $M_{P6}$ pr $M_{P5}$. Simultaneously, the first level shifter 1 operates to raise the potential at the output end to the supply voltage (3.3 V) and to lower to 0 V the potential at the output end so as to concur with the second level shifter 2 operation.

As a result, according to the level shifter of this example, stably establishing the logic levels of the output signal $S_{OUT}$ and the inverted output signal $S_{OUTB}$ to be at either one of the "L" level or "H" level is possible. Here, an example of the waveform of the output signal $S_{OUT}$ and the inverted output signal $S_{OUTB}$ to be output from the level shifter of this example is given in FIG. 8 and FIG. 9.

Furthermore, as described above, the respective output ends (node $N_A$ and node $N_B$) of the first level shifter 1 and the second level shifter 2 are connected to each other, and the respective inverted output ends (node $N_C$ and node $N_D$) are also connected to each other. Accordingly, the signal output from the drain of either of the transistor $M_{P5}$ or $M_{P6}$ turned on is returned to the first level shifter 1 so as to completely complement the operation of either of the transistor $M_{P3}$ or $M_{P4}$; where the transistors $M_{P5}$ and $M_{P6}$ configure the second level shifter 2, and the transistors $M_{P3}$ and $M_{P4}$ configure the first level shifter 1. At the same time, the drain of either of the transistor $M_{P6}$ or $M_{P5}$ that enters the low impedance state is always lead to establishment of its potential by the high impedance state transistor $M_{N4}$ or $M_{N3}$; where the transistors $M_{N4}$ and $M_{N3}$ configures the first level shifter 1. Therefore, the slow response speed can be complemented.

Accordingly, this exemplary level shifter is capable of normally operating even if the output signal voltage amplitude is more than double the input signal voltage amplitude.

Furthermore, this exemplary level shifter, as described above, is tolerant to input noise and power noise and is thus capable of stable operation since the operation of the high impedance state transistors $M_{N3}$ and $M_{N4}$, which configure the first level shifter 1, are always supplemented by the fully on transistors $M_{N5}$ and $M_{N6}$, which configure the second level shifter 2; in addition, the fully on transistors $M_{N3}$ and $M_{N4}$, which configure the first level shifter 1, supplement the operation of the low impedance state transistors $M_{N5}$ and $M_{N6}$, which configure the second level shifter 2.

Furthermore, this exemplary level shifter operates at a high operating frequency since the first level shifter 1 operates so as to supplement the operation of the second level shifter 2 while taking advantage of the fast response time of the second level shifter 2. Accordingly, this exemplary level shifter is capable of reliably performing level shift operations even for high frequency input signals.

Furthermore, since this exemplary level shifter has a short period from when the input signal has changed to when the output signal reaches a stable level, the time a current passes through the level shifter is also short, thereby reducing power consumption.

Furthermore, this exemplary level shifter, in the case where the difference in voltage level between the input signal and the output signal is small, may have desired characteristics without systematically unbalancing the drive capability (gate width) of the transistor $M_{P4}$ and drive capability (gate width) of the transistor $M_{N4}$, which configure the level shifter.

Next, simulation results when input voltage is varied for the level shifter of FIG. 1 are given in FIG. 10 through FIG. 15 based on the assumption that the transistor $M_{P3}$ gate width to be 2 $\mu$m, the transistor $M_{P4}$ gate width to be 2 $\mu$m, the transistor $M_{N3}$ gate width to be 60 $\mu$m, the transistor $M_{N3}$ gate width to be 60 $\mu$m, the transistor $M_{P5}$ gate width to be 8 $\mu$m, the transistor $M_{P6}$ gate width to be 8 $\mu$m, the transistor $M_{N5}$ gate width to be 2 $\mu$m, and the transistor $M_{N4}$ gate width to be 2 $\mu$m. It should be noted that in FIG. 10 through FIG. 15, the vertical axis represents input signal voltage (V) and the horizontal axis represents time (nS (nanoseconds)).

It can be understood from FIG. 10 through FIG. 15 that the output voltage amplitude remains steady at roughly 3.3 V even if the input voltage is varied as 2.0 V, 1.5 V, 1.4 V, 1.3 V, 1.2 V, and 1.0 V, and that the duty ratio barely changes. Nevertheless, there is the problem that the output voltage lower limit ("L" level) floats slightly above 0 V as the input voltage decreases. It can be seen from FIG. 15 that this "float" in voltage is approximately 0.2 V when 1.0 V is input. This arises from a flow-through current passing through the second level shifter 2, whereby the level shifter waveform itself becomes cause for power consumption increase although waveform shaping may be easily performed through an inverter receiving the output voltage. Accordingly, level shifters with reduced power consumption are described hereafter with the second and the third embodiment.

B. Second Embodiment

Next, the second embodiment of the present invention is described.

Figure 16:
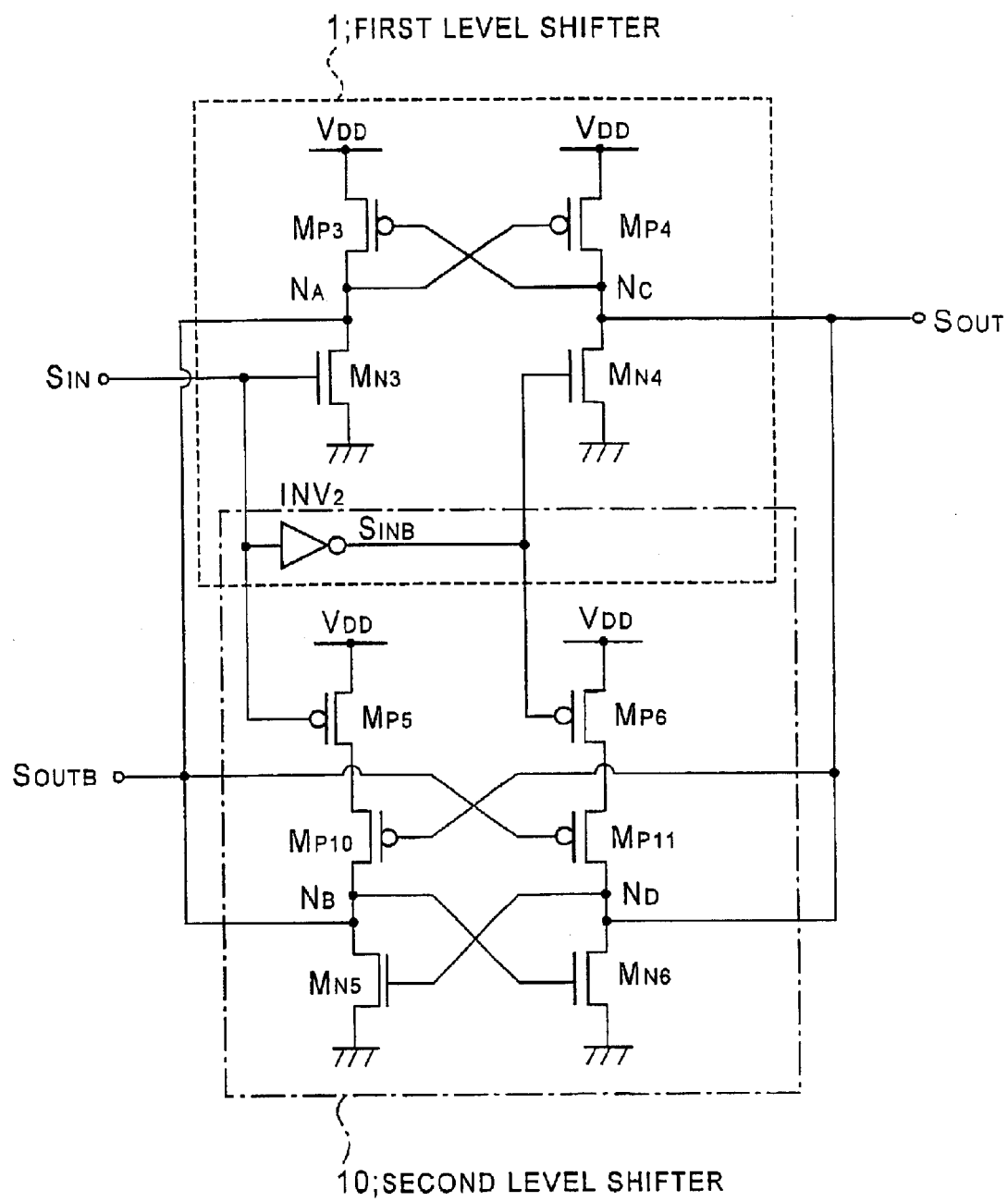
FIG. 16 is a circuit diagram illustrating the configuration of a level shifter, which is a second embodiment of the present invention.
Figure 17:
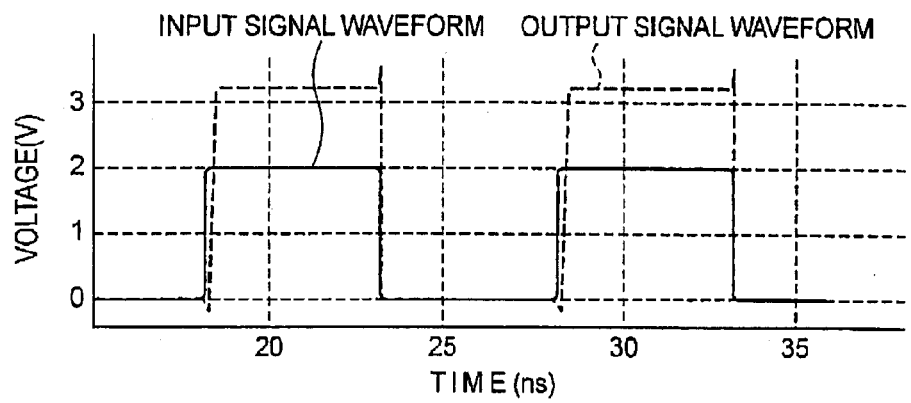
FIG. 17 is an input/output waveform graph at the time of a 2.0 V input voltage according to the second embodiment of the present invention.
Figure 18:
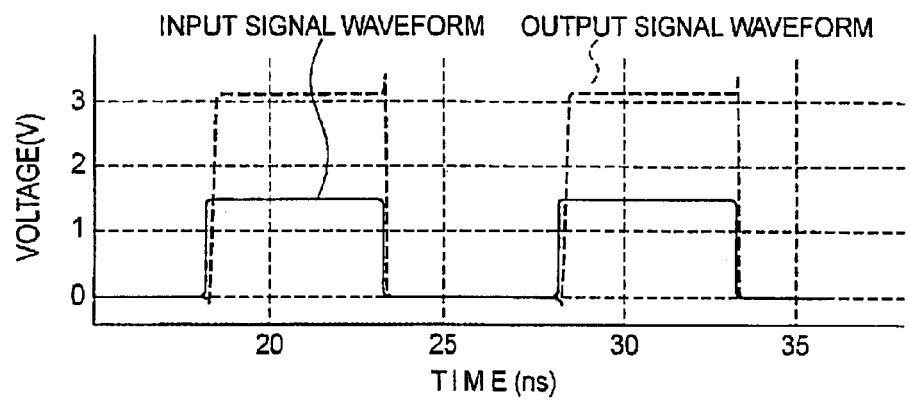
FIG. 18 is an input/output waveform graph at the time of a 1.5 V input voltage according to the second embodiment of the present invention.
Figure 19:
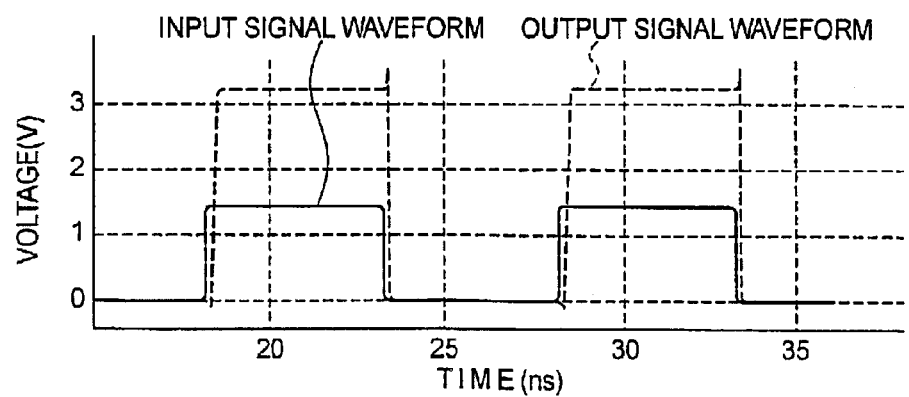
FIG. 19 is an input/output waveform graph at the time of a 1.4 V input voltage according to the second embodiment of the present invention.
Figure 20:
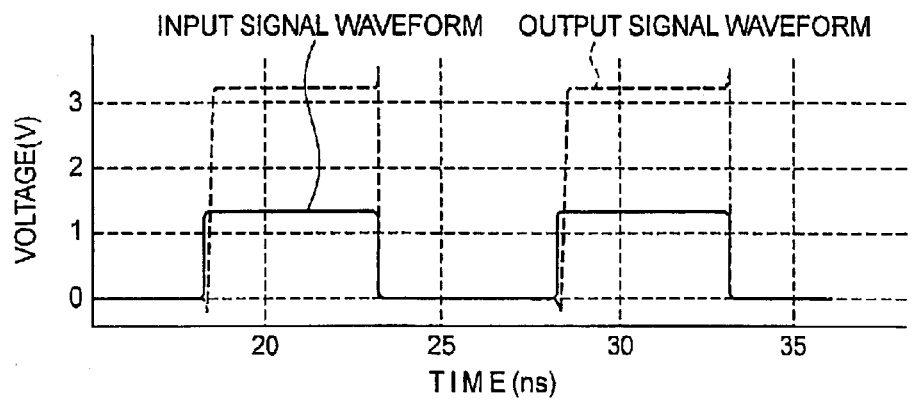
FIG. 20 is an input/output waveform graph at the time of a 1.3 V input voltage according to the second embodiment of the present invention.
Figure 21:
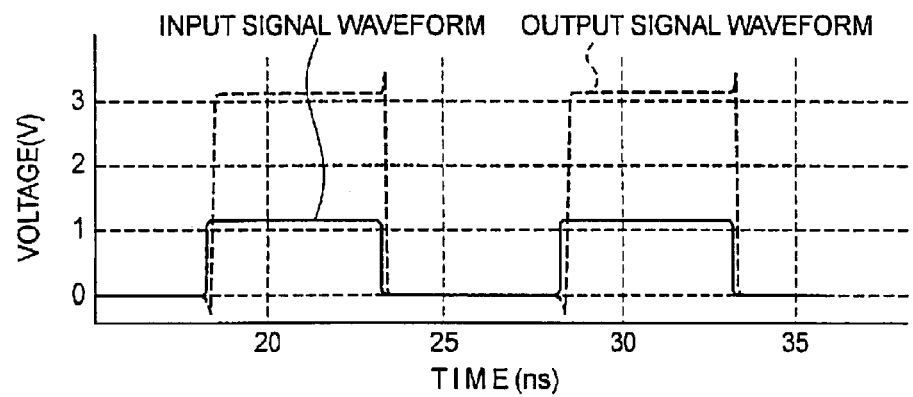
FIG. 21 is an input/output waveform graph at the time of a 1.2 V input voltage according to the second embodiment of the present invention.
Figure 22:
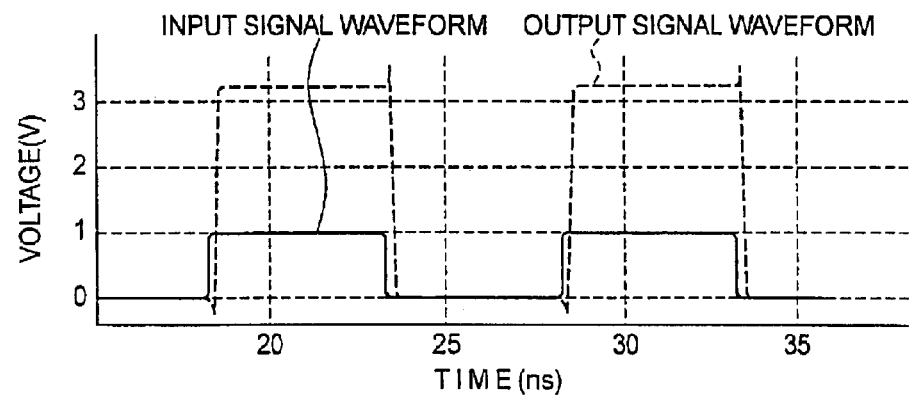
FIG. 22 is an input/output waveform graph at the time of a 1.0 V input voltage according to the second embodiment of the present invention.
Figure 23:
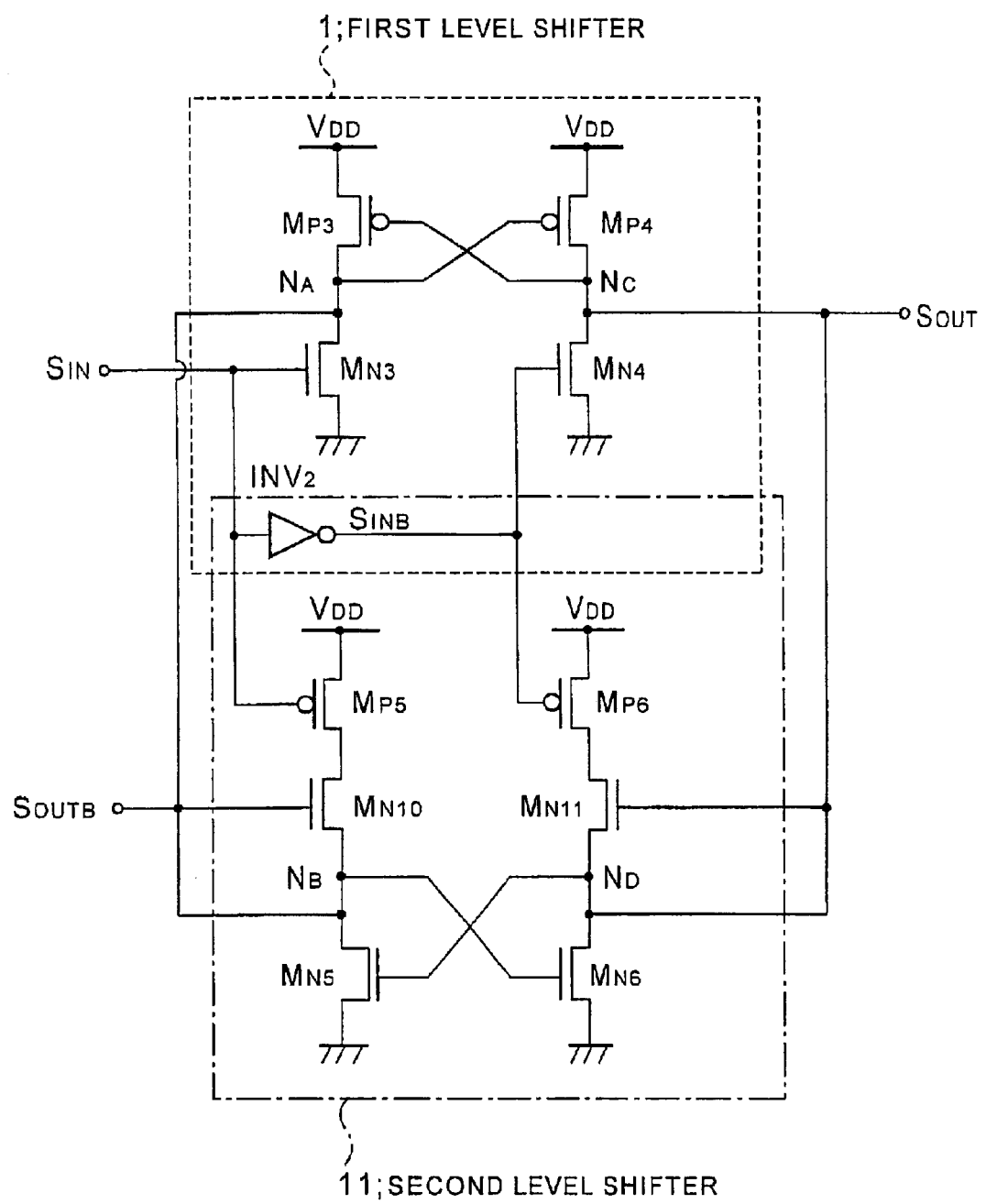
FIG. 23 is a circuit diagram illustrating the configuration of a level shifter, which is a third embodiment of the present invention.
Figure 24:
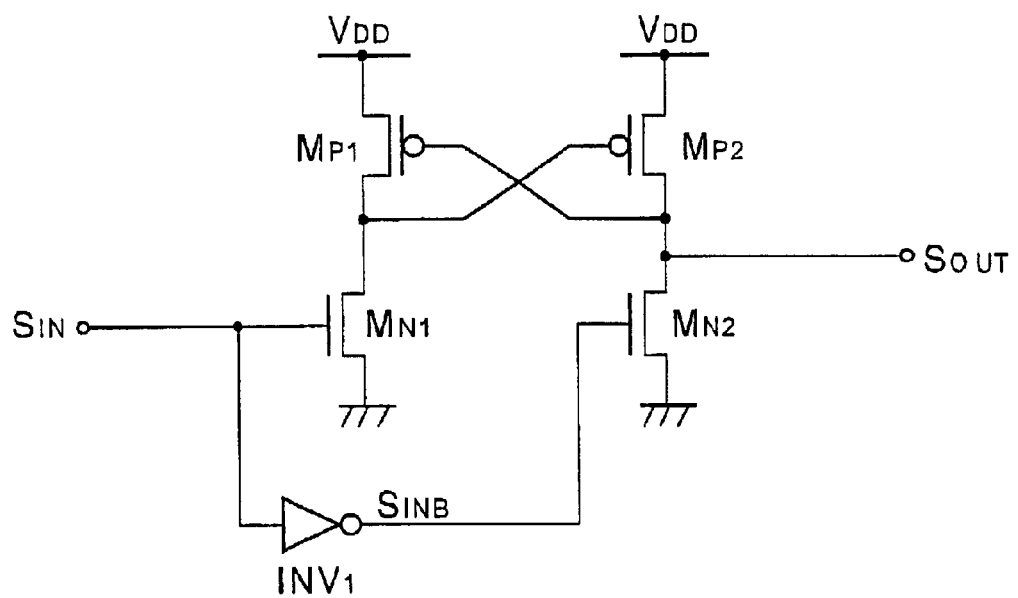
FIG. 24 is a circuit diagram illustrating a structural example of a conventional level shifter (first level shifter)
Figure 25:
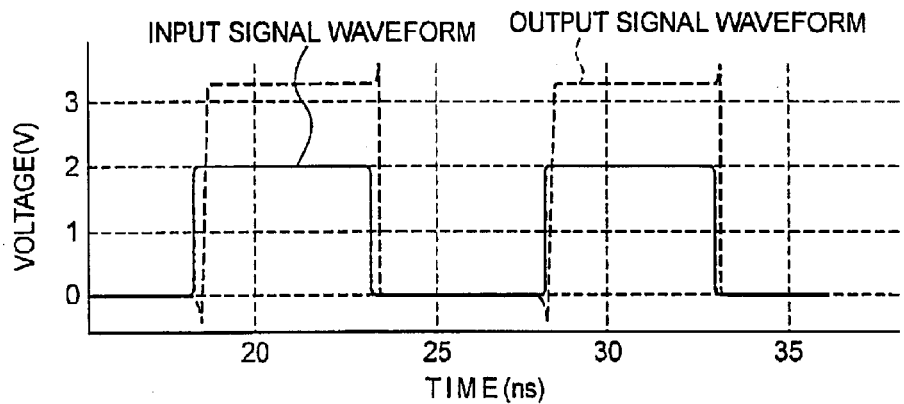
FIG. 25 is an input/output waveform graph at the time of a 2.0 V input voltage according to the conventional level shifter (first level shifter)
Figure 26:
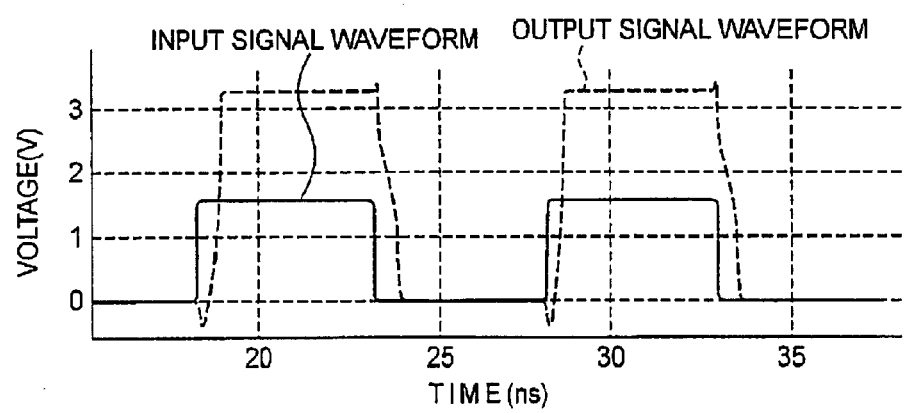
FIG. 26 is an input/output waveform graph at the time of a 1.5 V input voltage according to the conventional level shifter (first level shifter)
Figure 27:
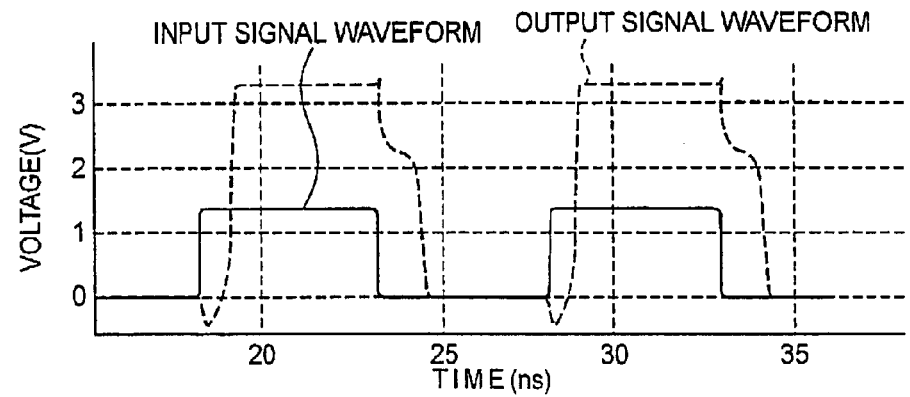
FIG. 27 is an input/output waveform graph at the time of a 1.4 V input voltage according to the conventional level shifter (first level shifter)
Figure 28:
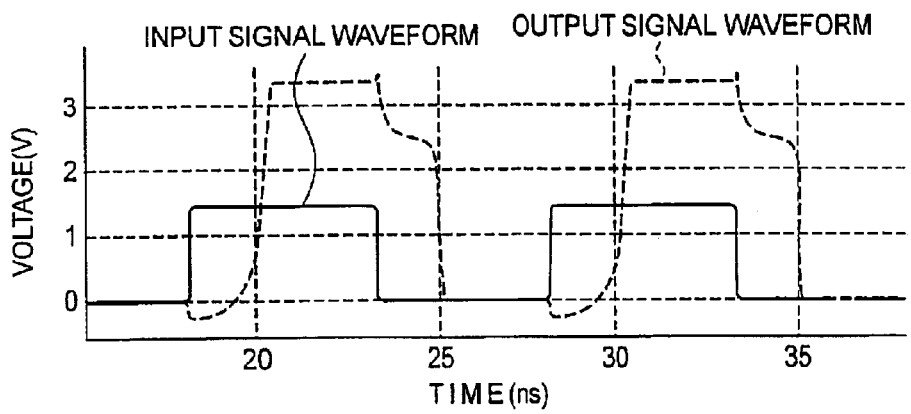
FIG. 28 is an input/output waveform graph at the time of a 1.3 V input voltage according to the conventional level shifter (first level shifter)
Figure 29:
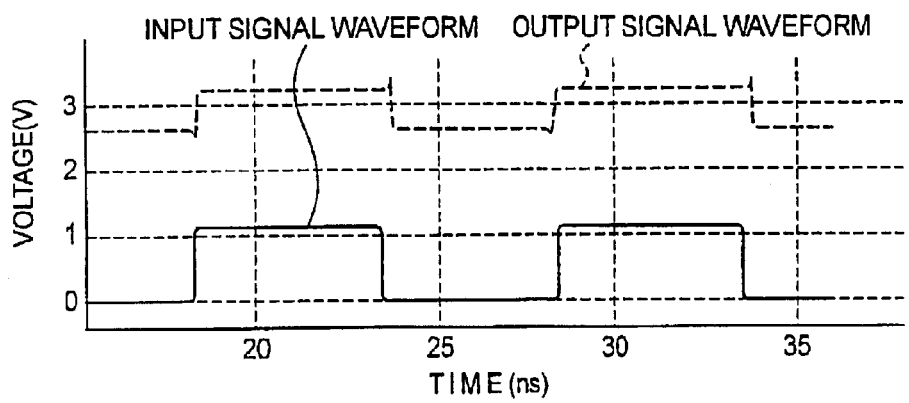
FIG. 29 is an input/output waveform graph at the time of a 1.2 V input voltage according to the conventional level shifter (first level shifter)
Figure 30:
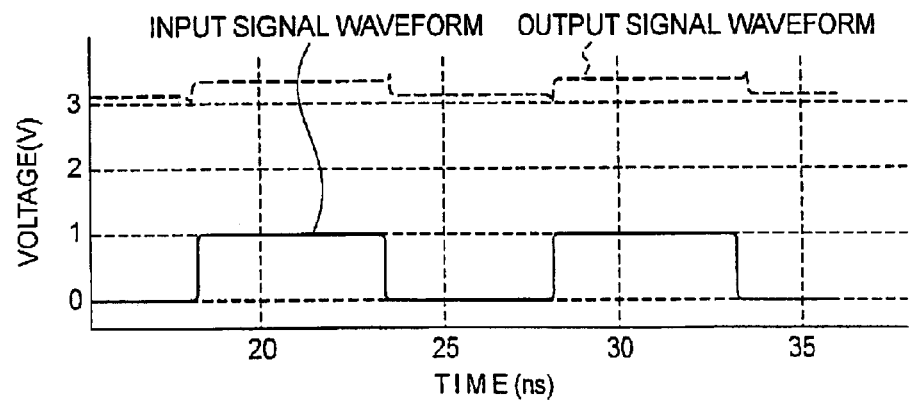
FIG. 30 is an input/output waveform graph at the time of a 1.0 V input voltage according to the conventional level shifter (first level shifter)

FIG. 16 is a circuit diagram illustrating the configuration of a level shifter, which is the second embodiment of the present invention. In this diagram, the same reference numerals are applied to the same parts corresponding to each part of FIG. 1, wherewith duplicate descriptions will be omitted. Replacing the second level shifter 2 shown in FIG. 1, a second level shifter 10 is newly provided to the level shifter illustrated in FIG. 16. The first level shifter 1 and the second level shifter 10 have a node $N_A$ and node $N_B$ that are connected, as well as a node $N_C$ and node $N_D$ that are connected. This exemplary level shifter operates such that the first level shifter 1 and second level shifter 10 complement each other's shortcomings, thus can be called a complementary level shifter.

The second level shifter 10 is configured from the inverter $INV_2$, 3.3 V-tolerant P-channel transistors $M_{P5}$, $M_{P6}$, $M_{P10}$ and $M_{P11}$, and 3.3 V-tolerant N-channel transistors $M_{N5}$ and $M_{N6}$. The transistor $M_{P5}$ has a 3.3 V supply voltage $V_{DD}$ applied to its source and an input signal $S_{IN}$ applied to its gate, where its drain is connected to the transistor $M_{P10}$ source. The transistor $M_{P6}$ has a 3.3 V supply voltage $V_{DD}$ applied to its source and an inverted input signal $S_{INB}$ applied to its gate, where its drain is connected to the transistor $M_{P11}$ source. The transistor $M_{P10}$ has its gate connected to the transistor $M_{P11}$ drain, where that drain is connected to the transistor $M_{N5}$ drain, as well as a negative logic 3.3 V amplitude inverted output signal $S_{OUTB}$ is output from that drain. The transistor $M_{P11}$ has its gate connected to the transistor $M_{P10}$ drain, where that drain is connected to the transistor $M_{N6}$ drain, as well as a positive logic 3.3 V amplitude output signal $S_{OUT}$ is output from that drain. The transistor $M_{N5}$ has its gate connected to the transistor $M_{P11}$ drain, and its source is grounded. The transistor $M_{N6}$ has its gate connected to the transistor $M_{P10}$ drain, and its source is grounded.

In other words, since the second level shifter 10 is provided with the P-channel transistors $M_{P5}$ and $M_{P6}$ at the input stage, and respective gates of the N-channel transistors $M_{N5}$ and $M_{N6}$ are connected to the other's drain, it can also be called a P-channel transistor input-type cross-connect circuit. The connecting point of the transistor $M_{P10}$ drain and the transistor $M_{N5}$ drain is the node $N_B$, and the connecting point of the transistor $M_{P11}$ drain and the transistor $M_{N6}$ drain is the node $N_D$.

It should be noted that the threshold voltage Vt for the gate voltage of all the transistors $M_{P5}$, $M_{P6}$, $M_{P10}$, $M_{P11}$, $M_{N5}$ and $M_{N6}$ is assumed to be 0.7 V.

In the above-configured level shifter, the second level shifter 10 has the transistor $M_{P10}$ directly connected between the transistor $M_{P5}$ drain and the transistor $M_{N5}$ drain, and the output signal $S_{OUT}$ used as feedback input for the transistor $M_{P10}$ gate. Furthermore, the transistor $M_{P11}$ is directly connected between the transistor $M_{P6}$ drain and the transistor $M_{N6}$ drain, and the inverted output signal $S_{OUTB}$ is used as feedback input for the transistor $M_{P11}$ gate. This is due to the reason given below.

Namely, with the level shifter according to the first embodiment described above, the transistors $M_{P5}$ and $M_{P6}$ enters a low impedance state, as indicated in FIG. 6, when the input signal $S_{IN}$ or the inverted input signal $S_{INB}$ with the potential $V_H$ (1.2 V) is applied to the respective gates. Consequently, a steady yet minute flow-through current passes through the respective source and drain of the transistors $M_{P5}$ and $M_{P6}$, even after the potentials of the output signals $S_{OUT}$ and $S_{OUTB}$ have reached stable levels.

In this example, due to the transistor $M_{P10}$ directly connecting between the transistor $M_{P5}$ drain and the transistor $M_{N5}$ drain, and using the output signal $S_{OUT}$ as feedback input for the transistor $M_{P10}$ gate, the transistor $M_{P10}$ fully turns off by the "H" level (3.3 V) output signal $S_{OUT}$ so as to completely interrupt at the transistor $M_{P10}$ the above steady flow-through current that flows through between the transistor $M_{P5}$ source and drain. Similarly, due to the transistor $M_{P11}$ directly connecting between the transistor $M_{P6}$ drain and the transistor $M_{N6}$ drain, and using the inverted output signal $S_{OUTB}$ as feedback input for the transistor $M_{P11}$ gate, the transistor $M_{P11}$ fully turns off by the "H" level (3.3 V) inverted output signal $S_{OUTB}$ so as to completely interrupt at the transistor $M_{P11}$ the above steady flow-through current that passes through between the source and the drain of the transistor $M_{P6}$.

In this manner, according to this exemplary configuration, the advantages that can be achieved in the first embodiment described above, as well as complete interruption of flow-through current allows further reduction in power consumption.

In this second embodiment, simulation results when input voltage is varied are given in FIG. 17 through FIG. 22 based on the assumption that the transistor $M_{P3}$ gate width to be 2 μm, the transistor $M_{P4}$ gate width to be 2 μm, the transistor $M_{N3}$ gate width to be 60 μm, the transistor $M_{N3}$ gate width to be 60 μm, the transistor $M_{N5}$ gate width to be 2 μm, the transistor $M_{N4}$ gate width to be 2 μm, the transistor $M_{P10}$ gate width to be 2 μm, and the transistor $M_{P11}$ gate width to be 2 μm. It should be noted that in FIG. 17 through FIG. 22, the vertical axis represents input signal voltage (V) and the horizontal axis represents time (nS (nanoseconds)).

It can be understood from FIG. 17 through FIG. 22 that the output voltage amplitude remains steady at roughly 3.3 V even if the input voltage is varied as 2.0 V, 1.5 V, 1.4 V, 1.3 V, 1.2 V, and 1.0 V, and that the duty ratio also barely changes. Furthermore, there was the problem of the output voltage lower limit slightly floating above 0 V in the first embodiment, however it is understood in the second embodiment that this "float" does not occur even if the input voltage is reduced.

Here, source current waveforms of the first embodiment and the second embodiment are described.

Figure 37:
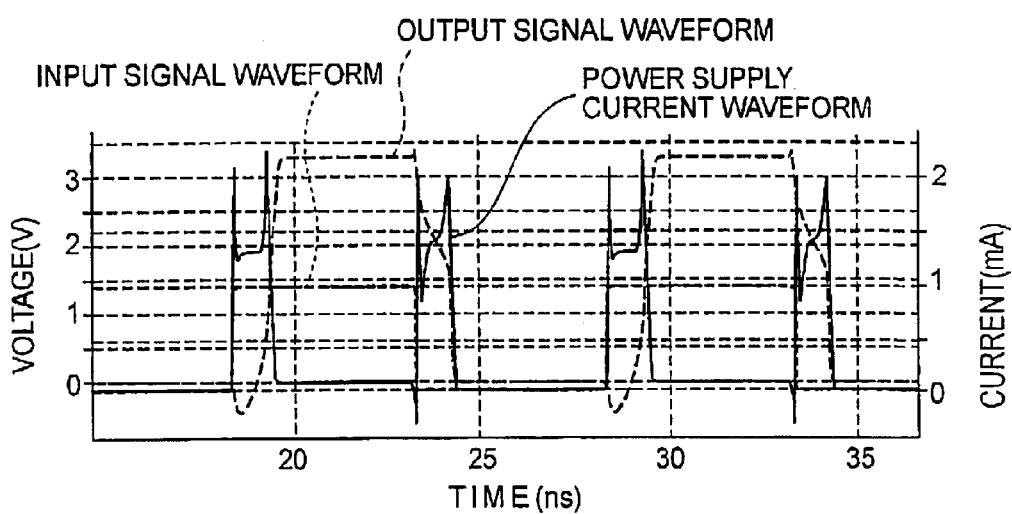
FIG. 37 is a power supply current waveform graph at the time of a 1.4 V input voltage according to the conventional level shifter (first level shifter)
Figure 39:
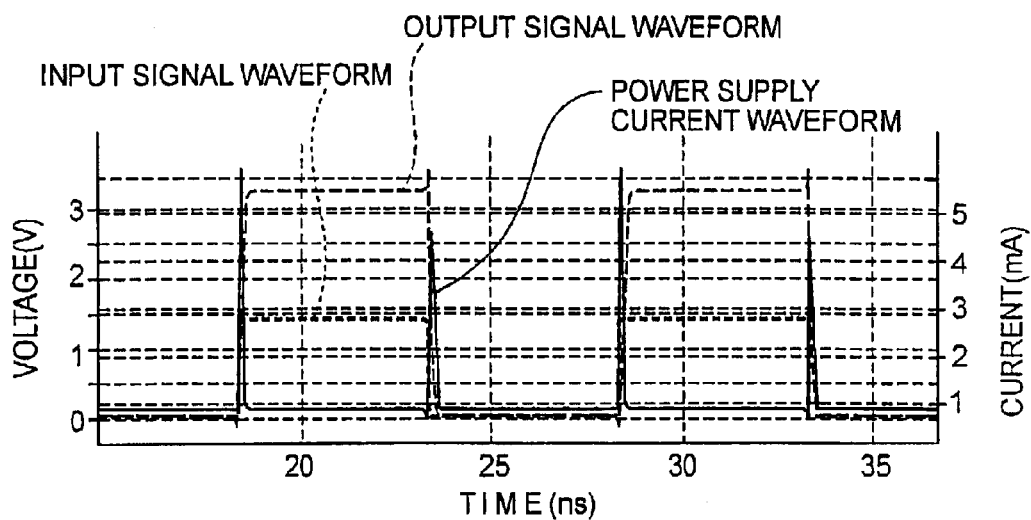
FIG. 39 is a power supply current waveform graph at the time of a 1.4 V input voltage according to the first embodiment of the present invention.
Figure 40:
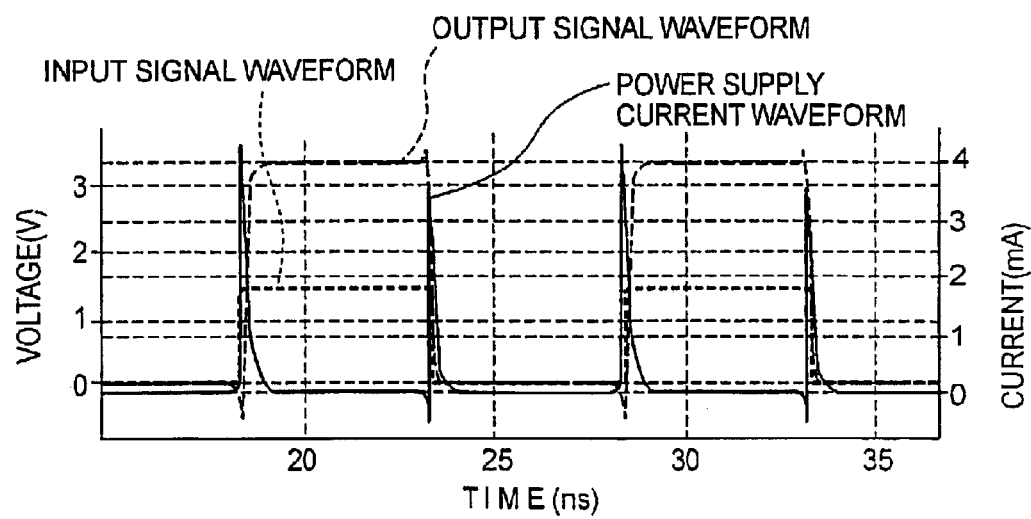
FIG. 40 is a power supply current waveform graph at the time of a 1.4 V input voltage according to the second embodiment of the present invention.

The source current waveform of the first embodiment, as shown in FIG. 39, has a large current flowing only during the period from when the input signal has changed to when the output signal reaches a stable level, therefore further reduction in power consumption than in the prior art shown in FIG. 37 and FIG. 38 can be seen. Nevertheless, in the first embodiment as described above, since the flow-through current is flowing through the second level shifter, an unintended current of approximately 0.8 mA is constantly flowing. In contrast, in the case of the source current waveform of the second embodiment, as shown in FIG. 40, a current that flows only during the period from when the input signal has changed to when the output signal reaches a stable level without the current that was constantly passing through. Accordingly, further reduction in power consumption than in the first embodiment can be seen. It should be noted that in FIG. 39 and FIG. 40, for the sake of comparing with the conventional waveforms in FIG. 37 and FIG. 38, the example used for the level shifter of the present invention is one where the input signal is 1.4 V.

Hereafter is described a third embodiment, which is a modification of the second embodiment.

C. Third Embodiment

Next, the third embodiment of the present invention is described.

Figure 11:
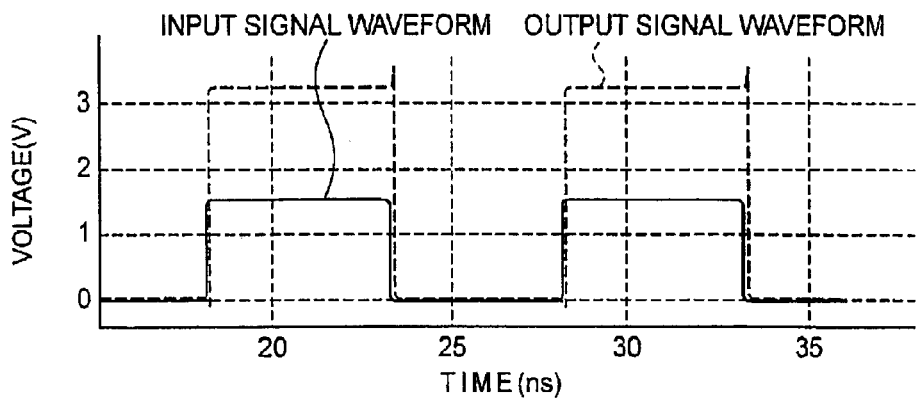
FIG. 11 is an input/output waveform graph at the time of a 1.5 V input voltage according to the first embodiment of the present invention.
Figure 12:
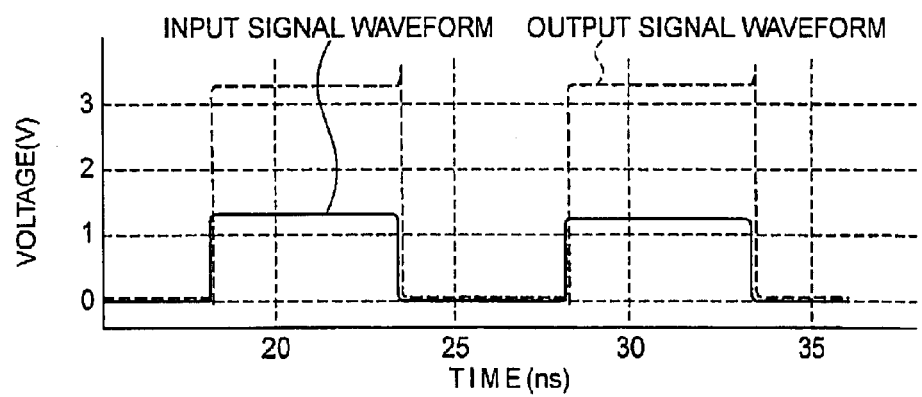
FIG. 12 is an input/output waveform graph at the time of a 1.4 V input voltage according to the first embodiment of the present invention.
Figure 13:
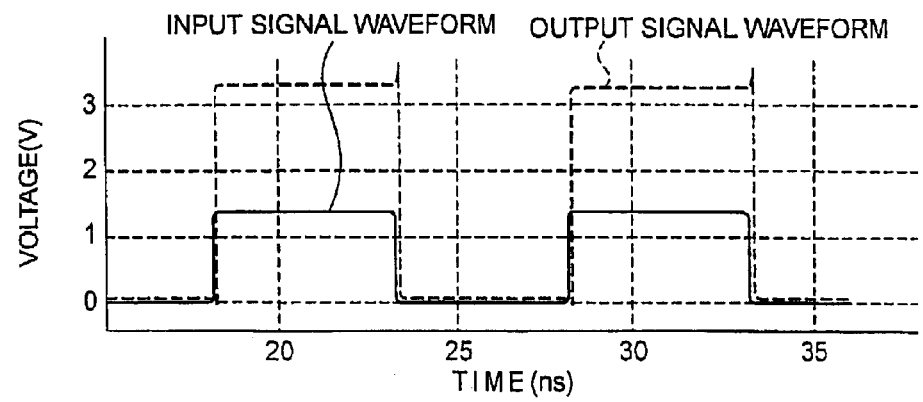
FIG. 13 is an input/output waveform graph at the time of a 1.3 V input voltage according to the first embodiment of the present invention.
Figure 14:
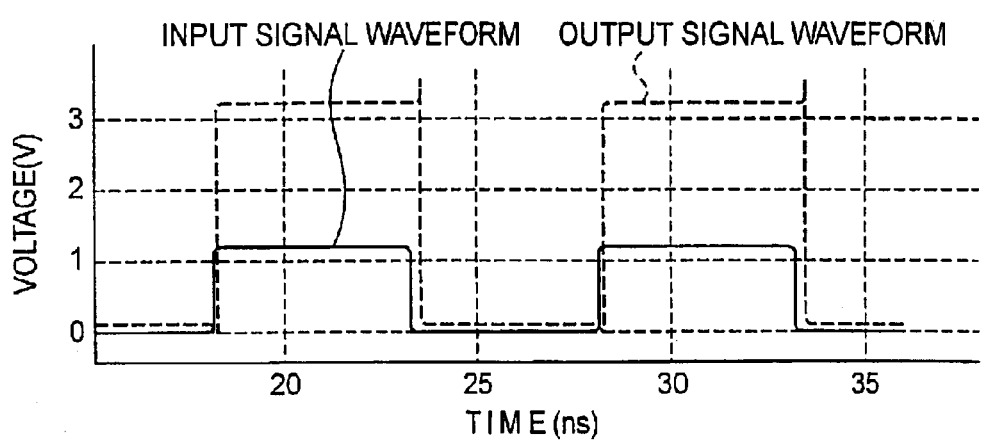
FIG. 14 is an input/output waveform graph at the time of a 1.2 V input voltage according to the first embodiment of the present invention.
Figure 15:
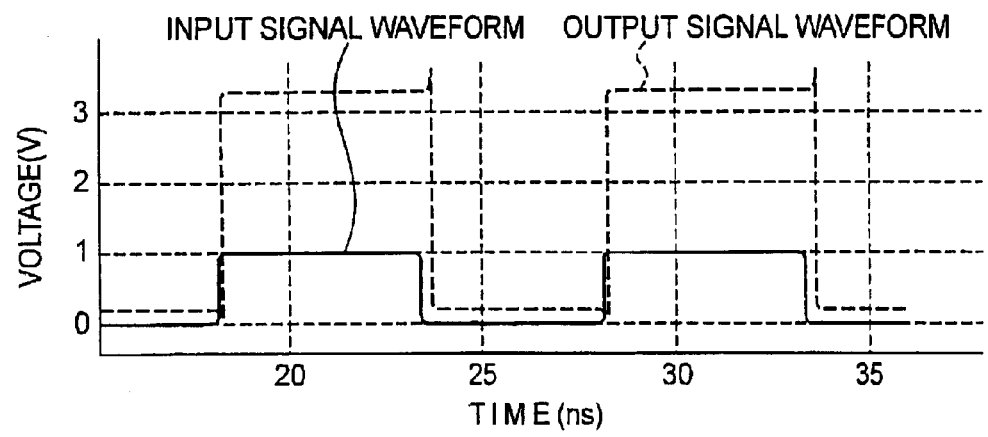
FIG. 15 is an input/output waveform graph at the time of a 1.0 V input voltage according to the first embodiment of the present invention.

FIG. 11 is a circuit diagram illustrating the configuration of a level shifter, which is the third embodiment of the present invention. In this diagram, the same reference numerals are applied to the same parts corresponding to each part of FIG. 1, wherewith duplicate descriptions will be omitted. Replacing the second level shifter 2 shown in FIG. 1, a second level shifter 11 is newly provided to the level shifter illustrated in FIG. 11. The first level shifter 1 and the second level shifter 11 have a node $N_A$ and node $N_B$ that are connected to each other, as well as a node $N_C$ and node $N_D$ that are connected to each other. This exemplary level shifter operates such that the first level shifter 1 and second level shifter 11 complement each other's shortcomings, thus can be called a complementary level shifter.

The second level shifter 11 is configured from the inverter $INV_2$, 3.3 V-tolerant P-channel transistors $M_{P5}$ and $M_{P6}$, and 3.3 V-tolerant N-channel transistors $M_{N5}$ $M_{N6}$, $M_{N10}$ and $M_{N11}$.

The transistor $M_{P5}$ has a 3.3 V supply voltage $V_{DD}$ applied to its source and an input signal $S_{IN}$ applied to its gate, where its drain is connected to the transistor $M_{P10}$ drain. The transistor $M_{P6}$ has a 3.3 V supply voltage $V_{DD}$ applied to its source and an inverted input signal $S_{INB}$ applied to its gate, where its drain is connected to the transistor $M_{P11}$ drain. The transistor $M_{N10}$ has its gate and source connected to the transistor $M_{N5}$ drain, as well as a negative logic 3.3 V amplitude inverted output signal $S_{OUTB}$ is output from that source. The transistor $M_{N11}$ has its gate and source connected to the transistor $M_{N6}$ drain, as well as a positive logic 3.3 V amplitude output signal $S_{OUT}$ is output from that source. The transistor $M_{N5}$ has its gate connected to the transistor $M_{N6}$ drain, and its source is grounded. The transistor $M_{N6}$ has its gate connected to the transistor $M_{N5}$ drain, and its source is grounded.

In other words, since the second level shifter 11 is provided with the P-channel transistors $M_{P5}$ and $M_{P6}$ at the input stage, and respective gates of the N-channel transistors $M_{N5}$ and $M_{N6}$ are connected to the other's drain, it can also be called a P-channel transistor input-type cross-connect circuit. The connecting point of the transistor $M_{N10}$ source and the transistor $M_{N5}$ drain is the node $N_B$, and the connecting point of the transistor $M_{N11}$ source and the transistor $M_{N6}$ drain is the node $N_D$.

It should be noted that the threshold voltage Vt for the gate voltage of all the transistors $M_{P5}$, $M_{P6}$, $M_{N5}$, $M_{N8}$, $M_{N10}$ and $M_{N11}$ is assumed to be 0.7 V.

In the above-configured level shifter, the second level shifter 11 has the transistor $M_{N10}$ directly connected between the transistor $M_{P5}$ drain and the transistor $M_{N5}$ drain, and the inverted output signal $S_{OUTB}$ used as feedback input for the transistor $M_{N10}$ gate. Furthermore, the transistor $M_{N11}$ is directly connected between the transistor $M_{P6}$ drain and the transistor $M_{N6}$ drain, and the output signal $S_{OUT}$ is used as feedback input for the transistor $M_{P11}$ gate. This is due to the reason given below.

Namely, with the level shifter according to the first embodiment described above, the transistors $M_{P5}$ and $M_{P6}$ enters a low impedance state, as indicated in FIG. 6, when the input signal $S_{IN}$ or the inverted input signal $S_{INB}$ with the potential $V_H$ (1.2 V) is applied to the respective gates. Consequently, a steady yet minute flow-through current passes through the respective source and drain of the transistors $M_{P5}$ and $M_{P6}$, even after the potentials of the output signals $S_{OUT}$ and $S_{OUTB}$ are established.

In this example, due to the transistor $M_{N10}$ directly connecting between the transistor $M_{P5}$ drain and the transistor $M_{N5}$ drain, and using the inverted output signal $S_{OUTB}$ as feedback input for the transistor $M_{N10}$ gate, the transistor $M_{N10}$ fully turns off by the "L" level (0 V) inverted output signal $S_{OUTB}$ so as to completely interrupt at the transistor $M_{N10}$ the above steady flow-through current that flows between the source and the drain of the transistor $M_{P5}$. Similarly, due to the transistor $M_{N11}$ directly connecting between the transistor $M_{P6}$ drain and the transistor $M_{N6}$ drain, and using the output signal $S_{OUT}$ as feedback input for the transistor $M_{N11}$ gate, the transistor $M_{N11}$ fully turns off by the "L" level (0 V) output signal $S_{OUT}$ so as to completely interrupt at the transistor $M_{N11}$ the above unintended constant flow-through current that flows between the source and the drain of the transistor $M_{P6}$.

In this manner, according to this exemplary configuration, the advantages that can be achieved in the first embodiment described above, as well as complete interruption of flow-through current as in the second embodiment allows further reduction in power consumption.

To this point, the embodiments of the present invention have been described with reference to the drawings, however, the specific configuration is not limited to these embodiments, wherewith modifications and such can be included in this invention without deviating from the technical spirit and scope of the present invention.

For example, although the example where the amplitude of the input signal $S_{IN}$ is 1.2 V and the output signal $S_{OUT}$ is 3.3 V is given for each of the embodiments described above, the present invention is not limited thereto, but also applicable in cases where the output signal voltage amplitude is more than double the input signal voltage amplitude.

Furthermore, the example where the inverter $INV_2$ has a CMOS structure, which is configured from a P-channel transistor and an N-channel transistor that have 1.2 V-tolerant characteristics with a supply voltage of 1.2 V, and inverts the 1.2 V amplitude input signal $S_{IN}$ so as to output an inverted input signal $S_{INB}$ with an amplitude of 1.2 V is given for each of the embodiments described above, yet is not limited thereto. Namely, the transistors configuring the inverter $INV_2$ may be configured with a transistor having a high voltage tolerant characteristic (for example, 3.3 V) that is higher than the supply voltage (1.2 V). It should be noted that in order to improve operation speed of the level shifter, it is preferable to quickly operate the inverter $INV_2$, whereby configuring with a transistor with small gate capacitance and low voltage tolerance is desirable.

Furthermore, for each of the embodiments described above, an inverter is described as an example of a circuit that generates inverted signals from input signals, however, appropriate substitution is possible as long as it is a NAND, NOR, or a circuit that generates inverted signals. It should be noted that with each of the embodiments, an inverter circuit with little delay time and simple circuitry is employed.

Furthermore, it is preferable that the gate width of the transistors $M_{N3}$ and $M_{N4}$ is larger than that of other transistors in order to quickly discharge the node $N_A$ and node $N_C$.

Furthermore, N-channel and P-channel MOS transistors are used for describing each of the embodiments described above, yet is not limited to the MOS transistor, where substitution of other transistors such as a bipolar transistor is also possible.

It should be noted that by mounting the level shifter of the present invention upon a chip as a semiconductor integrated circuit, the difference in voltage inside and outside the chip may be easily decreased, thereby chip versatility may be enhanced.

Furthermore, even with an information processing system that has this chip mounted on a motherboard or the like, the voltage difference from other chips and the like may easily be decreased, whereby simplicity of design of the information processing system may be enhanced.

As described above, even if the input signal voltage amplitude drops near the transistor threshold, a low power consumption level shifter that operates steadily and at high speed and is configured with the first level shifter and second level shifter is provided.

Furthermore, by adding a transistor for blocking the flow-through current to the second level shifter, further reduction in power consumption is possible.

What is claimed is:

1. A level shifter, comprising:
a first transistor of a first conduction type, which is connected between a first power supply line and a first node, has a control terminal connected to an input terminal to which an input signal is to be applied;
a second transistor of a second conduction type, which is connected between a second power supply line and the first node, has a control terminal connected to an output terminal;
an inverter, which is connected between the input terminal and a second node;
a third transistor of the first conduction type, which is connected between the first power supply line and the output terminal, has a control terminal connected to the second node;
a fourth transistor of the second conduction type, which is connected between the second power supply line and the output terminal, has a control terminal connected to the first node;
a fifth transistor of the second conduction type, which is connected between the second power supply line and the first node, has a control terminal connected to the input terminal;
a sixth transistor of the second conduction type, which is connected between the second power supply line and the output terminal, has a control terminal connected to the second node;
a seventh transistor of the first conduction type, which is connected between the first power supply line and the output terminal, has a control terminal connected to the first node; and
an eighth transistor of the first conduction type, which is connected between the first power supply line and the first node, has a control terminal connected to the output terminal.

2. The level shifter according to claim 1, further comprising:
a ninth transistor of the second conduction type, which is inserted between the fifth transistor and the first node, has a control terminal connected to the output terminal; and
a tenth transistor of the second conduction type, which is inserted between the sixth transistor and the output terminal, has a control terminal connected to the first node.

3. The level shifter according to claim 1, further comprising:
a ninth transistor of the first conduction type, which is inserted between the fifth transistor and the first node, has a control terminal connected to the first node; and
a tenth transistor of the first conduction type, which is inserted between the sixth transistor and the output terminal, has a control terminal connected to the output terminal.

4. The level shifter according to claim 1, wherein the first through eighth transistors have approximately the same voltage tolerance.

5. A level shifter, comprising:
a first transistor of a first conduction type, which is connected between a first power supply line and a first node, has a control terminal connected to an input terminal to which an input signal is to be applied;
a second transistor of a second conduction type, which is connected between a second power supply line and the first node, has a control terminal connected to an output terminal;
an inverter, which is connected between the input terminal and a second node;
a third transistor of the first conduction type, which is connected between the first power supply line and the output terminal, has a control terminal connected to the second node;

a fourth transistor of the second conduction type, which is connected between the second power supply line and the output terminal, has a control terminal connected to the first node; and a fifth transistor of the second conduction type, which is connected between the second power supply line and the first node, has a control terminal connected to the input terminal, wherein the first and the third transistor have a gate width larger than the other transistors.

6. The level shifter according to claim 2, wherein the ninth and the tenth transistor have the same gate width as the transistor with the smallest gate width from among the first through eighth transistors, or have a smaller gate width than the other transistors.

7. The level shifter according to claim 1, wherein the inverter has a lower voltage tolerance than the first through fifth transistors.

8. A level shifter, comprising:

a first transistor of a first conduction type, which is connected between a first power supply line and a first node, has a control terminal connected to an input terminal to which an input signal is to be applied;

a second transistor of a second conduction type, which is connected between the first node and a second power supply line, has a control terminal connected to an output terminal;

an inverter, which is connected between the input terminal and a second node;

a third transistor of the first conduction type, which is connected between the first power supply line and the output terminal, has a control terminal connected to the second node;

a fourth transistor of the second conduction type, which is connected between the second power supply line and the output terminal, has a control terminal connected to the first node;

a fifth transistor of the second conduction type, which is connected between the second power supply line and the first node, has a control terminal connected to the input terminal;

a sixth transistor of the second conduction type, which is connected between the second power supply line and the output terminal, has a control terminal connected to the second node;

a seventh transistor of the first conduction type, which is connected between the first power supply line and the output terminal, has a control terminal connected to the first node; and an eighth transistor of the first conduction type, which is connected between the first power supply line and the first node, has a control terminal connected to the output terminal.

9. A level shifter, comprising:

a first transistor of a first conduction type, which is connected between a first power supply line and a first node, has a control terminal connected to an input terminal to which an input signal is to be applied;

a second transistor of a second conduction type, which is connected between a first node and a second power supply line, has a control terminal connected to an output terminal;

an inverter, which is connected between the input terminal and a second node;

a third transistor of the first conduction type, which is connected between the first power supply line and the output terminal, has a control terminal connected to the second node;

a fourth transistor of the second conduction type, which is connected between the second power supply line and the output terminal, has a control terminal connected to the first node; and a fifth transistor of the first conduction type, which is connected between the first power supply line and the first node, has a control terminal connected to the output terminal;

a sixth transistor of the second conduction type, which is connected between the second power supply line and a third node, has a control terminal connected to the input terminal;

a seventh transistor of the first conduction type, which is connected between the first node and the third node, has a control terminal connected to the first node;

an eighth transistor of the first conduction type, which is connected between the first power supply line and the output terminal, has a control terminal connected to the first node;

a ninth transistor of the second conduction type, which is connected between the second power supply line and a fourth node, has a control terminal connected to the second node; and a tenth transistor of the first conduction type, which is connected between the fourth node and the output terminal, has a control terminal connected to the output terminal.

10. The level shifter according to claim 9, further comprising:

an eleventh transistor of the second conduction type, which is connected between the first transistor and the third node as a substitute for the seventh transistor, has a control terminal connected to the output terminal; and a twelfth transistor of the second conduction type, which is connected between the fourth node and the output terminal as a substitute for the tenth transistor, has a control terminal connected to the first node.

11. A semiconductor integrated circuit, comprising a level shifter according to claim 1.

12. An information processing system, comprising the semiconductor integrated circuit according to claim 11.

13. The level shifter according to claim 1, wherein the first and the third transistor have a gate width larger than the other transistors.

14. The level shifter according to claim 2, wherein the first and the third transistor have a gate width larger than the other transistors.

15. The level shifter according to claim 3, wherein the first and the third transistor have a gate width larger than the other transistors.

16. The level shifter according to claim 4, wherein the first and the third transistor have a gate width larger than the other transistors.

17. The level shifter according to claim 3, wherein the ninth and the tenth transistor have the same gate width as the transistor with the smallest gate width from among the first through eighth transistors, or have a smaller gate width than the other transistors.

18. A level shifter, comprising:

a first transistor of a first conduction type, which is connected between a first power supply line and a first node, has a control terminal receiving an input signal;

a second transistor of a second conduction type, which is connected between a second power supply line and the first node, has a control terminal connected to an output terminal;

a third transistor of the first conduction type, which is connected between the first power supply line and the output terminal, has a control terminal receiving an inverted input signal;

a fourth transistor of the second conduction type, which is connected between the second power supply line and the output terminal, has a control terminal connected to the first node;

a fifth transistor of the second conduction type, which is connected between the second power supply line and the first node, has a control terminal receiving said input signal;

a sixth transistor of the second conduction type, which is connected between the second power supply line and the output terminal, has a control terminal receiving said inverted input signal;

a seventh transistor of the first conduction type, which is connected between the first power supply line and the output terminal, has a control terminal connected to the first node; and an eighth transistor of the first conduction type, which is connected between the first power supply line and the first node, has a control terminal connected to the output terminal.

19. The level shifter according to claim 18, further comprising:

a ninth transistor of the second conduction type, which is inserted between the fifth transistor and the first node, has a control terminal connected to the output terminal; and a tenth transistor of the second conduction type, which is inserted between the sixth transistor and the output terminal, has a control terminal connected to the first node.

20. The level shifter according to claim 18, further comprising;

a ninth transistor of the first conduction type, which is inserted between the fifth transistor and the first node, has a control terminal connected to the first node; and a tenth transistor of the first conduction type, which is inserted between the sixth transistor and the output terminal, has a control terminal connected to the output terminal.

21. The level shifter according to claim 18, wherein the first through eighth transistors have approximately the same voltage tolerance.

22. The level shifter according to claim 19, wherein the ninth and the tenth transistors have the same gate width as the transistor with the smallest gate width from among the first through eighth transistors, or have a smaller gate width than the other transistors.

23. A level shifter, comprising:

a first transistor of a first conduction type, which is connected between a first power supply line and a first node, has a control terminal receiving an input signal;

a second transistor of a second conduction type, which is connected between a second power supply line and the first node, has a control terminal connected to an output terminal;

a third transistor of the first conduction type, which is connected between the first power supply line and the output terminal, has a control terminal receiving an inverted input signal;

a fourth transistor of the second conduction type, which is connected between the second power supply line and the output terminal, has a control terminal connected to the first node; and a fifth transistor of the second conduction type, which is connected between the second power supply line and the first node, has a control terminal receiving said input signal;

wherein the first and the third transistors have a gate width larger than the other transistors.

24. The level shifter according to claim 18, wherein the first and the third transistors have a gate width larger than the other transistors.

25. The level shifter according to claim 19, wherein the ninth and the tenth transistors have the same gate width as the transistor with the smallest gate width from among the first through eighth transistors, or have a smaller gate width than the other transistors.

* * * * *